(12) United States Patent
Stoler et al.

(10) Patent No.: US 8,089,378 B1
(45) Date of Patent: Jan. 3, 2012

(54) SYNCHRONOUS MULTI-CLOCK PROTOCOL CONVERTER

(75) Inventors: Gil Stoler, Nofit (IL); Eitan Joshua, Ramot Menashe (IL); Shaul Chapman, Alone Aba (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 0 days.

(21) Appl. No.: 12/706,605

(22) Filed: Feb. 16, 2010

Related U.S. Application Data

(60) Provisional application No. 61/153,486, filed on Feb. 18, 2009.

(51) Int. Cl.
H03M 7/00 (2006.01)

(52) U.S. Cl. .......... 341/61; 370/503; 375/354; 710/305; 713/400

(58) Field of Classification Search .............. 341/61; 370/503; 375/354; 710/305
See application file for complete search history.

(56) References Cited

U.S. PATENT DOCUMENTS

| | | | | |
|---|---|---|---|---|
| 5,909,563 A | * | 6/1999 | Jacobs | 710/305 |
| 6,424,688 B1 | * | 7/2002 | Tan et al. | 375/354 |
| 6,535,946 B1 | * | 3/2003 | Bryant et al. | 710/305 |
| 6,931,562 B1 | * | 8/2005 | Radjassamy | 713/501 |
| 6,982,575 B2 | * | 1/2006 | Stong | 327/141 |
| 7,333,516 B1 | * | 2/2008 | Sikkink et al. | 370/503 |
| 7,698,588 B2 | * | 4/2010 | Boerstler et al. | 713/400 |

* cited by examiner

Primary Examiner — Khai M Nguyen

(57) ABSTRACT

Some of the embodiments of the present disclosure provide a method of transferring data from a fast clock domain associated with a fast clock signal to a slow clock domain associated with a slow clock signal, the method comprising receiving first fast data from the fast clock domain during a first fast clock cycle, wherein the first fast clock cycle is a first full fast clock cycle in a first slow clock cycle; and propagating, during the first full fast clock cycle in the first slow clock cycle, the received first fast data to the slow clock domain. Other embodiments are also described and claimed.

17 Claims, 15 Drawing Sheets

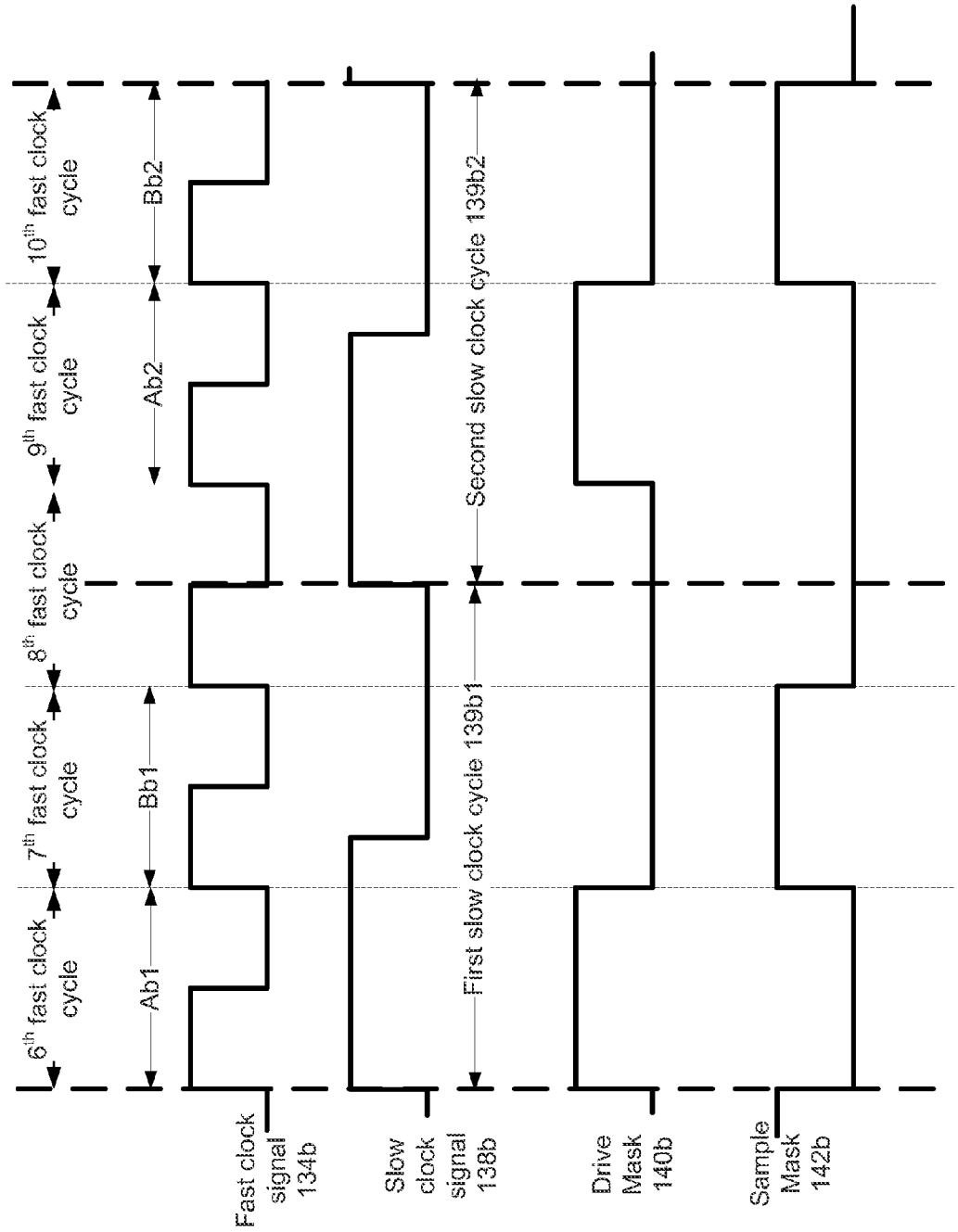

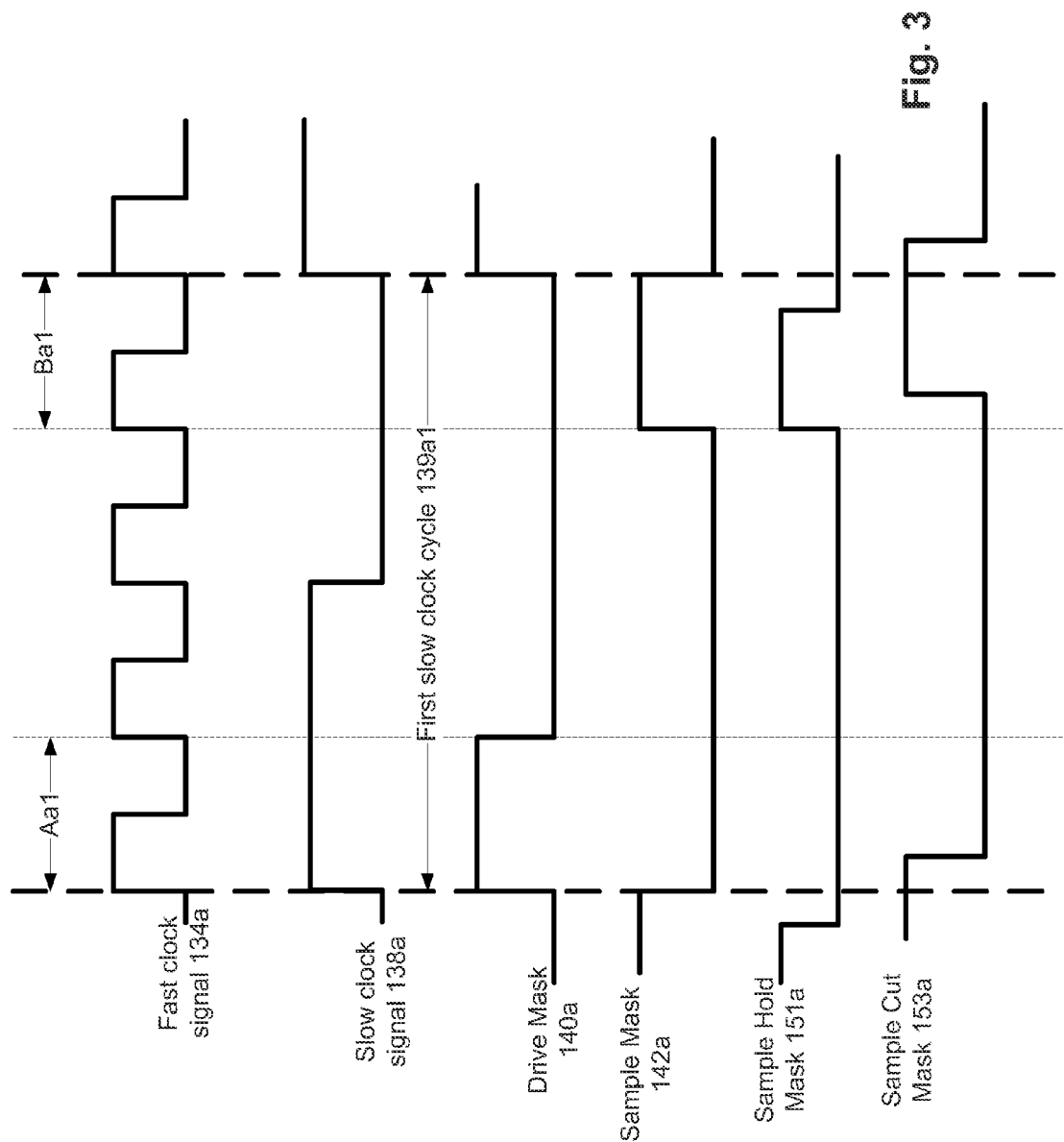

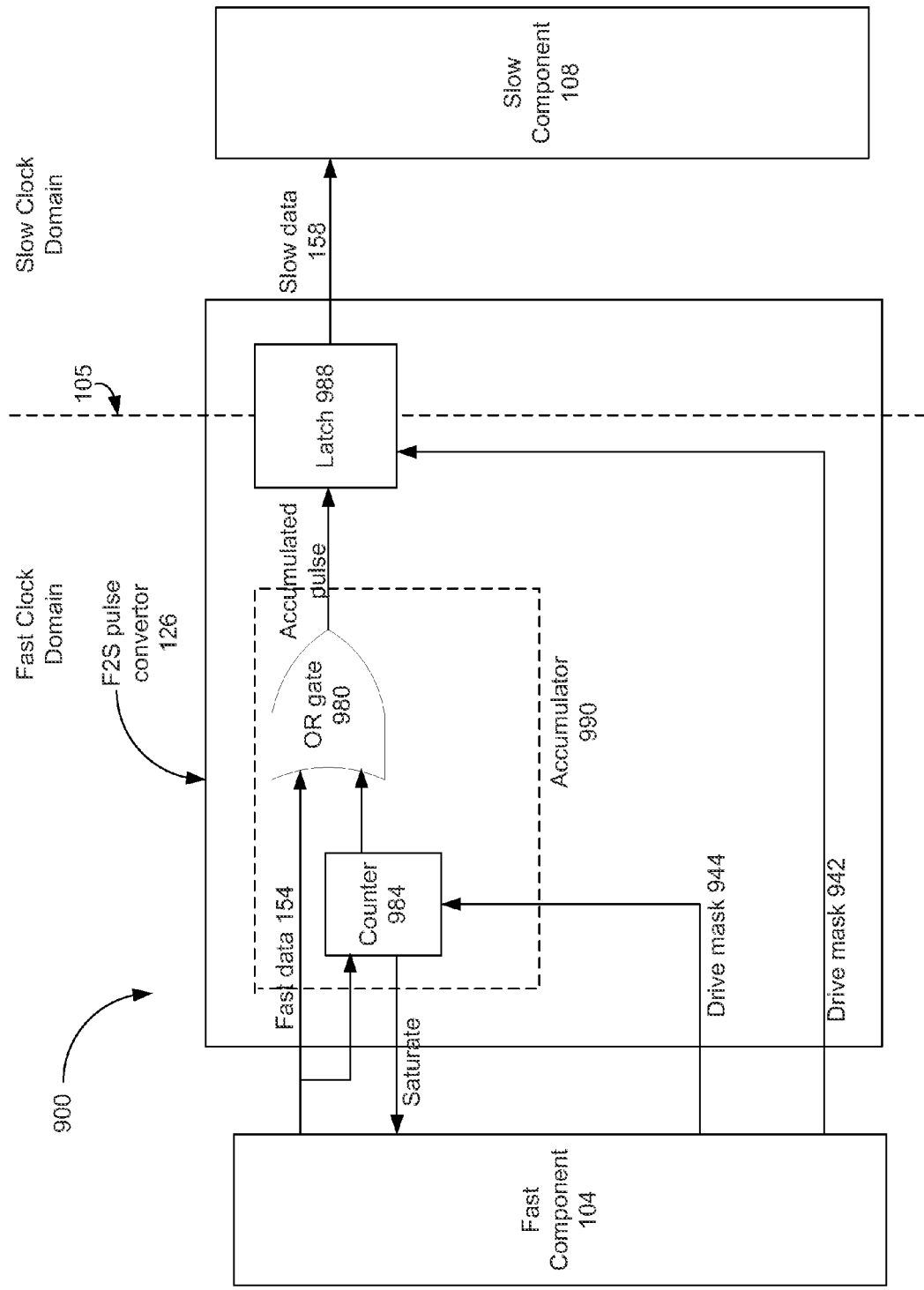

SYNCHRONOUS MULTI-CLOCK PROTOCOL CONVERTER

CROSS REFERENCE TO RELATED APPLICATIONS

The present application claims priority to U.S. Patent Application No. 61/153,486, filed Feb. 18, 2009, the entire specification of which is hereby incorporated by reference in its entirety for all purposes, except for those sections, if any, that are inconsistent with this specification.

TECHNICAL FIELD

Embodiments of the present disclosure relate to systems and methods for transferring data between different clock domains, and more specifically, to synchronous multi-clock protocol convertors.

BACKGROUND

An electronic system (e.g., an integrated circuit, a system on a chip (SOC), etc.) typically includes various components and/or modules associated with different clock signals operating at different clock speeds. In an example circuit, a first component is driven by a first clock signal having a first clock speed that is different from a second clock speed of a second clock signal that drives a second component. Although the first clock signal and the second clock signal may be synchronous, in some situations there may be slight timing mismatch between the two clock signals.

While transferring data between the first component and the second component, a bridge or a protocol convertor is often used to ensure seamless data transfer between the two different clock domains. It may be desirable that such a bridge or a protocol convertor has relatively low latency, is robust in view of timing uncertainties between the two different clock signals, easily integrates various types of components, and/or has a relatively simple structure.

The description in this section is related art, and does not necessarily include information disclosed under 37 C.F.R. 1.97 and 37 C.F.R. 1.98. Unless specifically denoted as prior art, it is not admitted that any description of related art is prior art.

SUMMARY

In various embodiments, the present disclosure provides a method for a transferring data from a fast clock domain associated with a fast clock signal to a slow clock domain associated with a slow clock signal, the method comprising receiving first fast data from the fast clock domain during a first fast clock cycle, wherein the first fast clock cycle is a first full fast clock cycle in a first slow clock cycle; and propagating, during the first full fast clock cycle in the first slow clock cycle, the received first fast data to the slow clock domain.

There is also provided a fast to slow (F2S) bus converter for transferring data from a fast clock domain associated with a fast clock signal to a slow clock domain associated with a slow clock signal, the fast clock signal including a plurality of fast clock cycles, and the slow clock signal including a plurality of slow clock cycles, the F2S bus converter comprising a first latch configured to propagate, during a first fast clock cycle, a first fast data from the fast clock domain to the slow clock domain, wherein the first fast clock cycle is a first full fast clock cycle in a first slow clock cycle; and a second latch configured to propagate a fast valid signal to the slow clock domain during the first fast clock cycle.

There is also provided a method of transferring data from a slow clock domain that is driven by a slow clock signal to a fast clock domain that is driven by a fast clock signal, the method comprising receiving slow data from the slow clock domain during a slow clock cycle; refraining from propagating the slow data to the fast clock domain during a first fast clock cycle that is at least partially in the slow clock cycle, wherein the first fast clock cycle is not a last full fast clock cycle in the slow clock cycle; and propagating, during at least a part of a second fast clock cycle, the received slow data to the fast clock domain, wherein the second fast clock cycle is a last full fast clock cycle in the slow clock cycle.

There is also provided a slow to fast (S2F) bus converter for transferring data from a slow clock domain associated with a slow clock signal to a fast clock domain associated with a fast clock signal, the S2F bus converter comprising a first latch configured to receive slow data from the slow clock domain and conditionally propagate the received slow data to the fast clock domain; and a second latch configured to receive a fast ready signal from the slow domain and conditionally propagate the fast ready signal to the slow domain.

There is also provided a method of transferring a plurality of pulses from a fast clock domain associated with a fast clock signal to a slow clock domain associated with a slow clock signal, the method comprising receiving a plurality of pulses from the fast clock domain, wherein one or more of the plurality of pulses are received during one or more fast clock cycles that are different from a first full fast clock cycle; accumulating the plurality of pulses; and propagating, to the slow clock domain, a first of the plurality of accumulated pulses during a first full fast clock cycle.

BRIEF DESCRIPTION OF THE DRAWINGS

In the following detailed description, reference is made to the accompanying drawings which form a part hereof wherein like numerals designate like parts throughout, and in which is shown by way of embodiments that illustrate principles of the disclosure. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

FIGS. 2a, 2b and 3 illustrate example timing diagrams of various signals associated with one or more components of the system of FIG. 1, in accordance with an embodiment of the present disclosure.

FIG. 9a schematically illustrates a system that includes a fast-to-slow pulse convertor, in accordance with an embodiment of the present disclosure.

DETAILED DESCRIPTION

Figure 1:
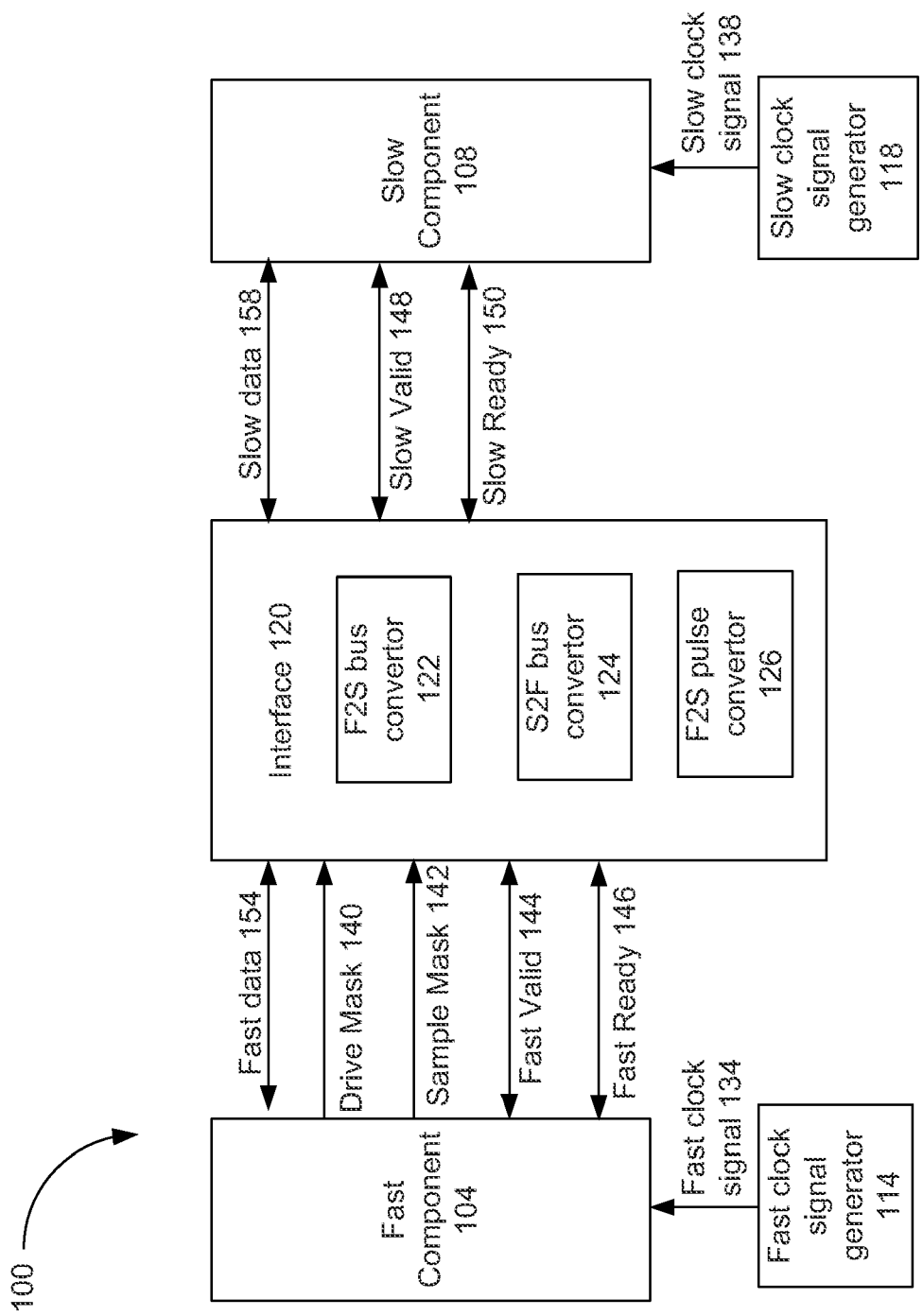
FIG. 1 schematically illustrates a system that includes a fast component associated with a fast clock signal and a slow component associated with a slow clock signal, in accordance with an embodiment of the present disclosure.

FIG. 1 schematically illustrates a system 100 that includes a fast component 104 associated with a fast clock signal 134 and a slow component 108 associated with a slow clock signal 138, in accordance with various embodiments of the present disclosure. The fast clock signal 134 drives one or more elements of the fast component 104, and the slow clock signal 138 drives one or more elements of the slow component 108. The fast component 104 receives the fast clock signal 134 from a fast clock signal generator 114, and the slow component 108 receives the slow clock signal 138 from a slow clock signal generator 118.

The fast clock signal 134 generally is relatively faster (e.g., has at least the same but generally a higher clock speed) than the slow clock signal 138. For this reason, various components and signals associated with the fast clock signal 134 (e.g., the fast component 104, the fast clock signal generator 114, and one or more other components and signals discussed herein later) are prefixed by the phrase "fast." Similarly, various components and signals associated with the slow clock signal 138 (e.g., the slow component 108, the slow clock signal generator 118, and one or more other components and signals discussed herein later) are prefixed by the phrase "slow."

In one embodiment, one or more components of the system 100 may be included in an integrated circuit, e.g., included in a System-on-a-chip (SoC). The fast component 104 and the slow component 108 may be any appropriate components or modules that are driven by a relatively fast clock signal and a relatively slow clock signal, respectively. In an example, the fast component 104 is a central processing unit with a fast clock signal 134 speed of about 1 Gigahertz, whereas the slow component 108 is a coherency fabric with a slow clock signal 138 speed of about 600 Megahertz (MHz). In another example, the fast component 104 is a coherency fabric with a fast clock signal 134 speed of about 600 MHz, whereas the slow component 108 is a Double Data Rate (DDR) memory controller with a slow clock signal 138 speed of about 400 Megahertz (MHz). Thus, in these examples, the ratio of slow clock speed to fast clock speed is 600 MHz to 1 GHz (or 3:5) and 400 MHz to 600 MHz (or 2:3). Thus, system 100 is also configured to address clock frequency ratios that are different from simple integer ratios (e.g., 1:N, where N is an integer).

Although in FIG. 1 the fast clock signal generator 114 is illustrated to be external to the fast component 104, in another embodiment the fast clock signal generator 114 is included in the fast component 104. Similarly, although in FIG. 1 the slow clock signal generator 118 is illustrated to be external to the slow component 108, in another embodiment the slow clock signal generator 118 is included in the slow component 108.

In one embodiment, the fast clock signal 134 is substantially synchronized with the slow clock signal 138, as will be discussed in more detail herein later. For the sake of brevity and to not obfuscate the teachings of this disclosure, one or more components (e.g., a phase locked loop operatively coupled to the fast clock signal generator 114 and/or slow clock signal generator 118) used for substantially synchronizing the fast clock signal 134 and the slow clock signal 138 are not illustrated in FIG. 1.

The system 100 also includes an interface 120 that interfaces between the fast component 104 and the slow component 108. In one embodiment, data is transferred between the fast component 104 and the slow component 108 through the interface 120. Data transfer between the fast component 104 and the interface 120 is driven by the fast clock signal 134. Accordingly, data that is transferred between the fast component 104 and the interface 120 is referred to as fast data 154. Data transfer between the slow component 108 and the interface 120 is driven by the slow clock signal 138. Accordingly, data that is transferred between the slow component 108 and the interface 120 is referred to as slow data 158.

In one embodiment, the fast component 104 generates a drive mask signal 140 and a sample mask signal 142, although in another embodiment these signals are generated by one or more other components of the system 100 (e.g., generated by the fast clock signal generator 114 and/or by one or more components that synchronize the fast clock signal 134 and the slow clock signal 138). The fast component 104 transmits the drive mask signal 140 and the sample mask signal 142 to the interface 120. The fast component 104 and the interface 120 trans-receives (e.g., transmits and/or receives) a fast valid signal 144 and a fast ready signal 146. The slow component 108 and the interface 120 also trans-receives a slow valid signal 148 and a slow ready signal 150. These signals are discussed in more detail below.

In one embodiment, the interface 120 includes a fast-to-slow bus convertor 122 (also referred to hereinafter as F2S bus convertor 122), a slow-to-fast bus convertor 124 (also referred to hereinafter as S2F bus convertor 124), and a fast-to-slow pulse convertor 126 (also referred to hereinafter as F2S pulse convertor 126). Each of these components will be discussed in more detail herein later.

For the purpose of this disclosure and unless otherwise mentioned, a clock cycle or a clock frame of a clock signal is associated with two consecutive rising edges of the clock signal. That is, duration between two consecutive rising edges of a clock signal represents a clock cycle or a clock frame. Thus, a clock cycle starts or begins with a rising edge of a clock signal, and ends with an immediate next (i.e., consecutive) rising edge of the clock signal. A fast clock cycle refers to a clock cycle of the fast clock signal 134, and a slow clock cycle refers to a clock cycle of the slow clock signal 138.

Figure 2A:
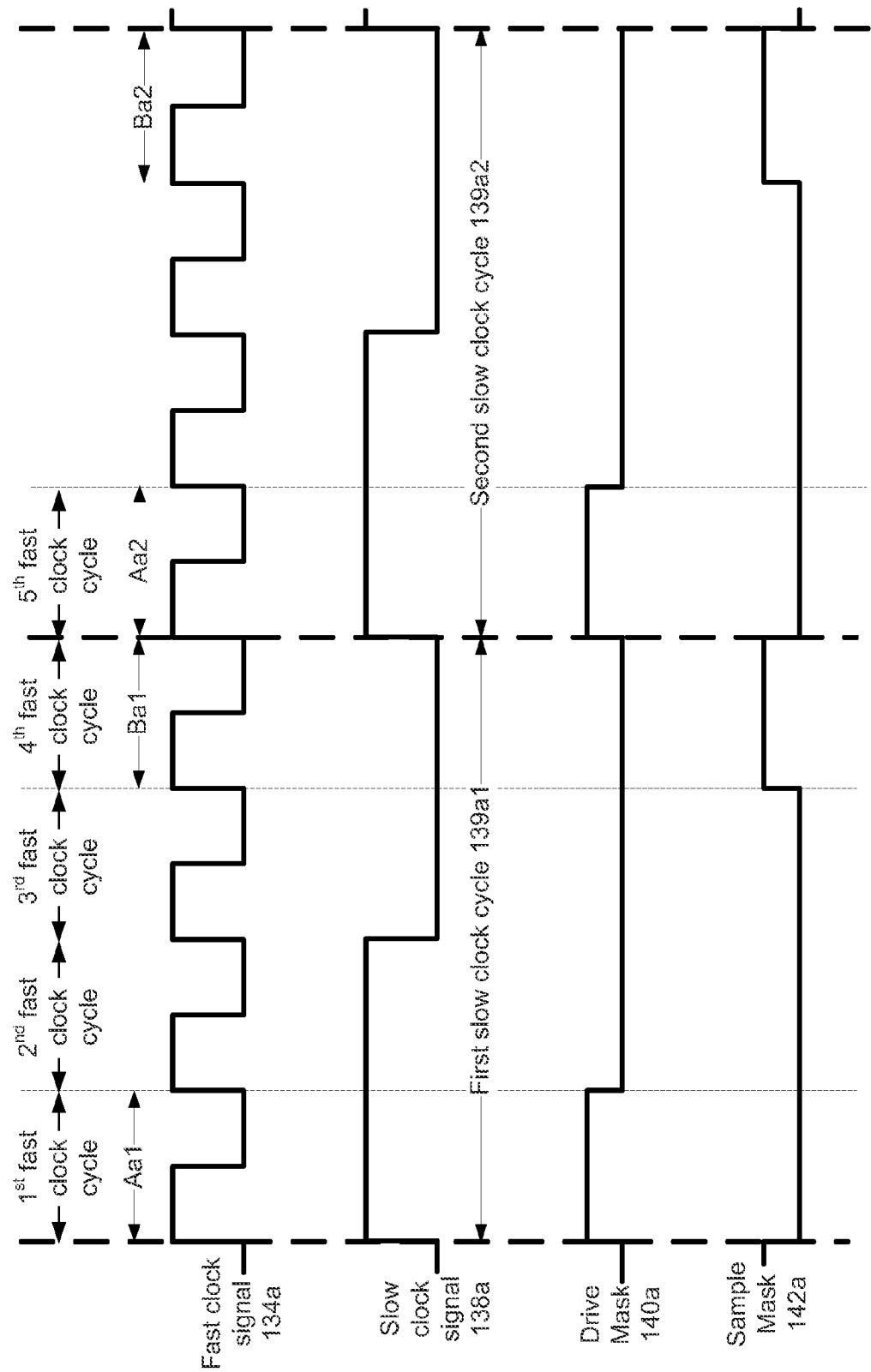

FIG. 2a illustrates example timing diagrams of various signals associated with one or more components of the system 100, in accordance with an embodiment of the present disclosure. For example, FIG. 2a includes timing diagrams of a fast clock signal 134a and a slow clock signal 138a. The fast clock signal 134*a* and the slow clock signal 138*a* of FIG. 2*a* are examples of the fast clock signal 134 and the slow clock signal 138 of FIG. 1, generated by the fast clock signal generator 114 and slow clock signal generator 118, respectively.

As previously mentioned, the fast clock signal 134*a* is substantially synchronized with the slow clock signal 138*a*. For example, a rising edge of the slow clock signal 138*a* in FIG. 2*a* is substantially aligned with a rising edge of the fast clock signal 134*a*.

The fast clock signal 134*a* is relatively faster than the slow clock signal 138*a*. In FIG. 2*a*, the speed of the fast clock signal 134*a* is assumed to be about 4 times than that of the slow clock signal 138*a*. Thus, the slow clock signal 138*a* and the fast clock signal 134*a* have a clock speed ratio of about 1:4. FIG. 2*a* illustrates two slow clock cycles (labeled as first slow clock cycle 139*a*1 and second slow clock cycle 139*a*2) of the slow clock signal 138*a*. As the clock speed ratio of the two clock signals is about 1:4, for every slow clock cycle of the slow clock signal 138*a*, there are about four fast clock cycles of the fast clock signal 134*a*. For example, the time duration of the first slow clock cycle 139*a*1 is equivalent to about four fast clock cycles (e.g., the first, second, third and fourth fast clock cycles), as illustrated in FIG. 2*a*.

For the purpose of this disclosure and unless otherwise mentioned, "a fast clock cycle is in a slow clock cycle" implies that at least a part of the fast clock cycle occurs while the slow clock cycle is occurring.

For the purpose of this disclosure and unless otherwise mentioned, "a full fast clock cycle is in a slow clock cycle" implies that the entire fast clock cycle occurs while the slow clock cycle is occurring. That is, the full fast clock starts concurrently with or after the start of the slow clock cycle, and the full fast clock ends concurrently with or before the end of the slow clock cycle. For example, the first, second, third and fourth fast clock cycles of FIG. 2*a* are full fast clock cycles in the first slow clock cycle 139*a*1. Similarly, the fifth fast clock cycle of FIG. 2*a* is a full fast clock cycle in the second slow clock cycle 139*a*2.

For the purpose of this disclosure and unless otherwise mentioned, a "first full fast clock cycle in a slow clock cycle" (also referred to herein as "first full fast clock cycle") refers to the first full fast clock cycle that occurs concurrently with or subsequent to the slow clock cycle has begun. That is, a first full fast clock cycle in a slow clock cycle refers to the first fast clock cycle that starts concurrently with or subsequent to the start of the slow clock cycle. For example, in FIG. 2*a*, the first fast clock cycle (labeled as Aa1) is the first full fast clock cycle in the first slow clock cycle 139*a*1, and the fifth fast clock cycle (labeled as Aa2) is the first full fast clock cycle in the second slow clock cycle 139*a*2.

For the purpose of this disclosure and unless otherwise mentioned, a "last full fast clock cycle in a slow clock cycle" (also referred to herein as "last full fast clock cycle") refers to the last full fast clock cycle that occurs concurrently with or prior to a completion of the slow clock cycle. That is, a last full fast clock cycle in a slow clock cycle refers to the last fast clock cycle that ends concurrently with or prior to a completion of the slow clock. For example, in FIG. 2*a*, the fourth fast clock cycle (labeled as Ba1) is the last full fast clock cycle in the first slow clock cycle 139*a*1, and the last full fast clock cycle in the second slow clock cycle 139*a*2 is labeled as Ba2.

FIG. 2*a* also illustrates timing diagram of a drive mask signal 140*a* and a sample mask signal 142*a*. The drive mask signal 140*a* and the sample mask signal 142*a* of FIG. 2*a* are examples of the drive mask signal 140 and the sample mask signal 142 of FIG. 1.

In one embodiment, the drive mask signal 140 of FIG. 1 is enabled (e.g., is in a logic high state) during each first full fast clock cycle. For example, the example drive mask signal 140*a* of FIG. 2*a* is enabled during Aa1 and Aa2 (i.e., during each of the illustrated first full fast clock cycles).

In one embodiment, the sample mask signal 142 of FIG. 1 is enabled during each last full fast clock cycle. For example, the example sample mask signal 142*a* of FIG. 2*a* is enabled during Ba1 and Ba2 (i.e., during each of the illustrated last full fast clock cycles).

FIG. 2*b* illustrates example timing diagrams of various signals associated with one or more components of the system 100, in accordance with an embodiment of the present disclosure. For example, FIG. 2*b* includes timing diagrams of a fast clock signal 134*b* and a slow clock signal 138*b*. The fast clock signal 134*b* and the slow clock signal 138*b* of FIG. 2*b* are examples of the fast clock signal 134 and the slow clock signal 138 of FIG. 1. In FIG. 2*b*, the slow clock signal 138*b* and the fast clock signal 134*b* are assumed to have a clock speed ratio of about 2:5. FIG. 2*b* illustrates two slow clock cycles (labeled as first slow clock cycle 139*b*1 and second slow clock cycle 139*b*2) of the slow clock signal 138*b*. As the clock speed ratio of the two clock signals is about 2:5, for every two slow clock cycles of the slow clock signal 138*b*, there are about five fast clock cycles of the fast clock signal 134*b*, as illustrated in FIG. 2*b*.

In FIG. 2*b*, the fast clock cycles are illustrated as the sixth through the tenth fast cock cycles. The sixth and seventh fast cock cycles are fully in the first slow clock cycle 139*b*1. That is, the sixth and seventh fast cock cycles are full fast clock cycles in the first slow clock cycle 139*b*1. Similarly, the ninth and tenth fast cock cycles are full fast clock cycles in the second slow clock cycle 139*b*2. The eighth fast clock cycle is partially in the first slow clock cycle 139*b*1 and partially in the second slow clock cycle 139*b*2.

FIG. 2*b* also illustrates timing diagram of a drive mask signal 140*b* and a sample mask signal 142*b*. The drive mask signal 140*b* and the sample mask signal 142*b* of FIG. 2*b* are examples of the drive mask signal 140 and the sample mask signal 142 of FIG. 1.

As previously mentioned, the fast clock signal 134*a* is substantially synchronized with the slow clock signal 138*a*. For example, a rising edge of every alternate slow clock signal 138*b* in FIG. 2*b* is substantially aligned with a rising edge of the fast clock signal 134*b*. Thus, a rising edge of the first slow clock cycle 139*b*1 is substantially aligned with a rising edge of the sixth fast clock cycle. Accordingly, the sixth fast clock cycle (labeled as Ab1) represents the first full fast clock cycle in the slow clock cycle 139*b*1.

However, a rising edge of the second slow clock cycle 139*b*2 is not aligned with a rising edge of a fast clock cycle. Rather, a rising edge of the second slow clock cycle 139*b*2 is aligned with a falling edge of the eighth fast clock cycle. Thus, the first fast clock cycle that begins after the beginning of the second slow clock cycle 139*b*1 is the ninth fast clock cycle (labeled as Ab2 in FIG. 2*b*), which represents the first full fast clock cycle in the second slow clock cycle 139*b*2.

Thus, the first full fast clock cycles in FIG. 2*b* are labeled as Ab1 and Ab2. Accordingly, the drive mask signal 140*b* of FIG. 2*b* is enabled during Ab1 and Ab2 (i.e., during each of the illustrated first full fast clock cycles).

Similarly, the last full fast clock cycle in the first slow clock cycle 139*b*1 is the seventh fast clock cycle (labeled as Bb1), and the last full fast clock cycle in the second slow clock cycle 139*b*2 is the tenth fast clock cycle (labeled as Bb2). Accordingly, the sample mask signal 140*b* of FIG. 2*b* is enabled during Bb1 and Bb2 (i.e., during each of the illustrated last full fast clock cycles).

Although the fast clock signal 134 and the slow clock signal 138 in FIG. 1 are substantially synchronized, in some situations there may be slight timing mismatch between the two clock signals (timing mismatch in a range of, for example, few picoseconds). Such timing mismatch may arise due to various factors, including, for example, different propagation delays in the clock trees of the fast clock signal 134 and the slow clock signal 138. For example, although the falling edge of the first slow clock cycle 139*a*1 in FIG. 2*a* is illustrated to be substantially aligned with a falling edge of the fourth fast clock cycle, in one embodiment the falling edges of these two clock cycles associated with the two different clock signals may not be perfectly aligned. Accordingly, it may be desirable for the interface 120 to be robust enough so that the interface 120 effectively handles such minor timing mismatch between the fast and slow clock signals.

In one embodiment, in order to effectively handle such timing mismatch issues (as will be discussed in more detail below), the sample mask signal 142 of FIG. 1 (including the example sample mask signals 142*a* and 142*b* of FIGS. 2*a* and 2*b*, respectively) is split in two signals: a sample hold mask signal and a sample cut mask signal. Although not illustrated in FIG. 1, a sample hold mask signal and a sample cut mask signal are illustrated in FIGS. 3-8 and described below.

FIG. 3 illustrates example timing diagrams of various signals associated with one or more components of the system 100, in accordance with an embodiment of the present disclosure. The timing diagrams of FIG. 3 are at least in part similar to those of FIG. 2*a*. However, unlike FIG. 2*a*, the timing diagrams of FIG. 3 illustrate only one slow clock cycle (e.g., the first slow clock cycle 139*a*1). Furthermore, the sample mask signal 142*a* of FIG. 2*a* is split in a sample hold mask signal 151*a* and a sample cut mask signal 153*a* in FIG. 3.

As illustrated in FIGS. 2*a* and 3, the sample mask signal 142*a* is enabled for the entire duration of the last full fast clock cycle (labeled as Ba1). However, in one embodiment, the sample hold mask signal 151*a* is enabled substantially simultaneously with the beginning of the last full fast clock cycle, and ends before the end of the last full fast clock cycle, or can be clock gated to be asserted only during a first phase of the last full fast clock cycle. Thus, in one embodiment, the sample hold mask signal 151*a* may start with a start of the sample mask signal 142*a*, but end earlier than the sample mask signal 142*a*. The sample hold mask signal 151 may end when the fast clock is de-asserted (about the middle of the fast clock cycle in a 50% duty cycle clock). In an embodiment, the sample hold mask signal 151 may start earlier (e.g., although not illustrated in FIG. 3), at about the same time (as illustrated in FIG. 3), or later than (although not illustrated in FIG. 3) the sample cut mask 153 (as long as it starts within the slow clock cycle period), and the sample hold mask signal 151 ends following the fast clock falling edge, but still before the next rising edge of the fast clock cycle. In an embodiment, the sample hold mask signal 151 is clock gated for timing considerations, and is derived from the sample mask signal 142*a*. In an embodiment, generating a clock-gated typed sample hold mask signal 151 may require generation of a pre-sample-mask signal one fast clock prior to the fast clock cycle in which the sample hold mask signal is generated, although this may not be the case in other signal generation configurations. In another embodiment, the sample hold mask signal 151 is not a clock gated signal (e.g., instead, is a full fast clock cycle mask signal).

The duration between the end of the sample hold mask signal 151*a* and the end of the last full fast clock cycle (i.e., the margin between the sample mask signal 142*a* and the sample hold mask signal 151*a*) may be based on various factors, including but not limited to relative clock speeds of the fast and slow clocks, an estimate of possible timing mismatch between the fast and slow clocks, a processing speed of the interface 120, and/or the like.

In one embodiment, the sample cut mask signal 153*a* is enabled after the beginning of the last full fast clock cycle, and ends after the end of the last full fast clock cycle. Thus, the sample cut mask signal 153*a* may be similar to the sample mask signal 142*a*, but shifted towards the right (i.e., starts later than the sample mask signal 142*a*), as illustrated in FIG. 3. In an embodiment, the sample hold 151*a* and sample cut mask signal 153*a* is derived from the same sample mask signal 142*a*.

The duration between the beginning of the last full fast clock cycle and the beginning of the sample cut mask signal 153*a* and/or the duration between the end of the last full fast clock cycle and the end of the sample cut mask signal 153*a* (i.e., the margin between the sample mask signal 142*a* and the sample cut mask signal 153*a*) may be based on various factors, including but not limited to relative clock speeds of the fast and slow clocks, an estimate of possible timing mismatch between the fast and slow clocks, a processing speed of the interface 120, and/or the like.

Although not illustrated in any of the figures, the example sample mask signal 142*b* of FIG. 2*b* may also be split into corresponding sample hold mask signal (that is enabled at about the beginning of the last full fast clock cycle) and sample cut mask (that is enabled after the beginning of the last full fast clock cycle).

Figure 4:
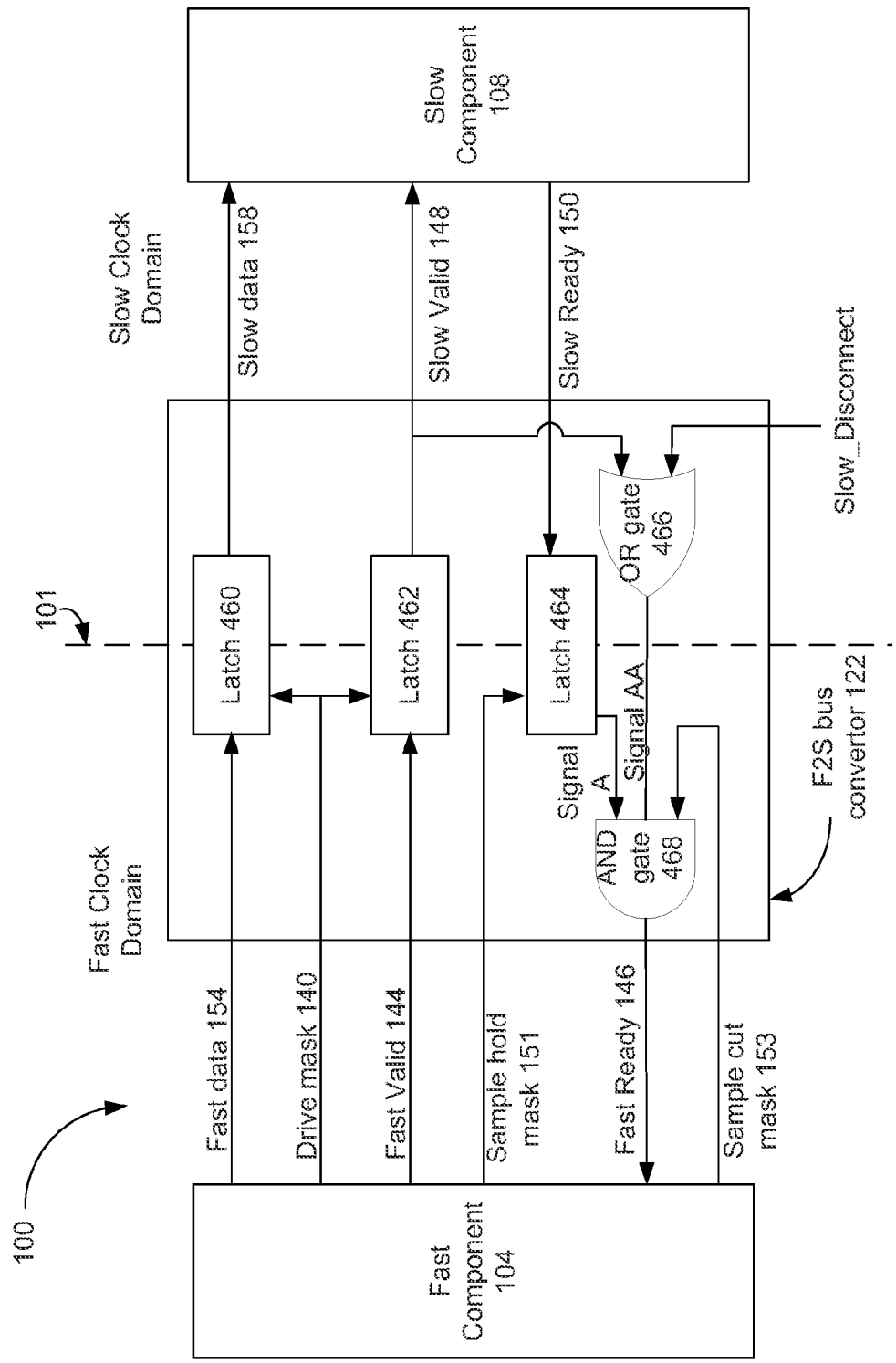
FIG. 4 schematically illustrates the system of FIG. 1, in which a fast-to-slow bus convertor is illustrated in more detail, in accordance with an embodiment of the present disclosure.

FIG. 4 schematically illustrates the system 100 of FIG. 1, in which the F2S bus convertor 122 is illustrated in more detail, in accordance with an embodiment of the present disclosure. Although the F2S bus convertor 122 is included in the interface 120 (as illustrated in FIG. 1), the interface 120 is not illustrated in FIG. 4 for the purpose of clarity and to not obfuscate the principle teachings of this disclosure. For similar reasons, the S2F bus convertor 124, the F2S pulse convertor 126, the fast clock signal generator 114, and the slow clock signal generator 118 of FIG. 1 are also not illustrated in FIG. 4.

Referring again to FIG. 4, the system 100 is divided in two clock domains by a dotted line 101. For the sake of simplifying the explanation of this disclosure, it is assumed that the domain to the left of the dotted line includes one or more components (e.g., the fast component 104) that are driven by the fast clock signal 134, and the domain to the right of the dotted line includes one or more components (e.g., the slow component 108) that are driven by the slow clock signal 138. The teachings of this disclosure, however, are not limited by any such assumptions.

Accordingly, the left domain of the dotted line 101 is labeled as fast clock domain, and the right domain of the dotted line 101 is labeled as slow clock domain.

Figure 5:
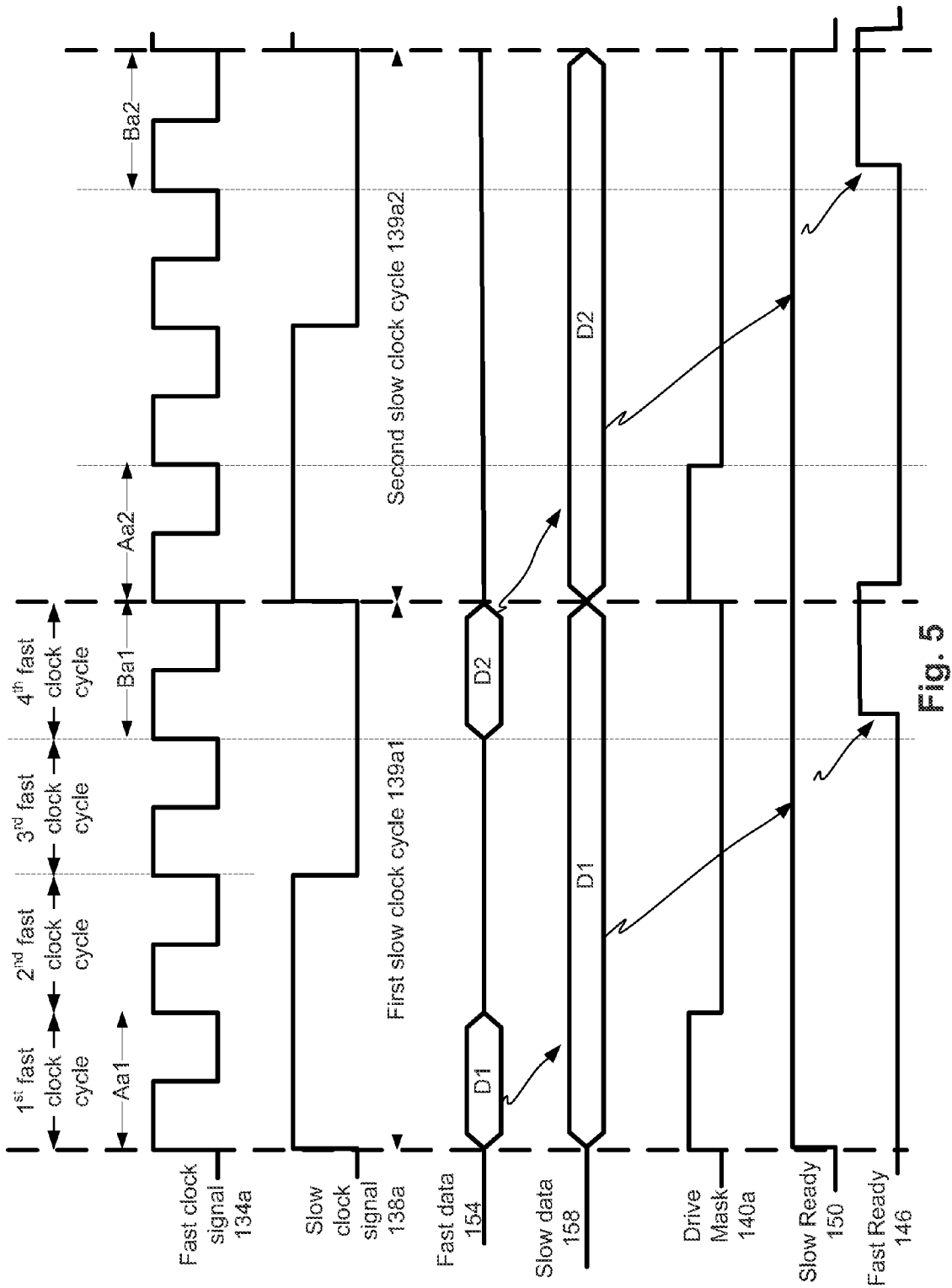
FIG. 5 illustrates example timing diagrams of various signals associated components of the system of FIG. 4, in accordance with an embodiment of the present disclosure.

FIG. 5 illustrates example timing diagrams of various signals associated with one or more components of the system 100 of FIG. 4, in accordance with an embodiment of the present disclosure. The timing diagrams in FIG. 5 are at least in part similar to those in FIG. 2*a*. However, in addition to the timing diagrams of FIG. 2*a*, FIG. 5 includes example timing diagrams of the fast data 154 and slow data 158.

Referring again to FIG. 4, the F2S bus convertor 122 includes latches 460, 462 and 464, a logic OR gate 466, and a logic AND gate 468. The latch 460 receives fast data 154 from the fast component 104, and selectively transmits the received fast data 154 to the slow component 108 based at least in part on the drive mask signal 140 received from the fast component 104. For example, the latch 460 transmits the received fast data 154 to the slow component 108 when the drive mask signal 140 is enabled. Thus, the latch 460 transmits the received fast data 154 to the slow component 108 during one or more of the first full fast clock cycles (as the drive mask signal 140 is enabled during the first full fast clock cycles, as previously discussed).

Any fast data 154 received by the latch 460 from the fast component 104 during a first full fast clock cycle is propagated (e.g., transmitted as slow data 158) to the slow domain during the slow clock cycle in which the first full fast clock cycle was received. Any fast data 154 received by the latch 460 from the fast component 104 during any other fast clock cycles (e.g., any fast clock cycle other than a first full fast clock cycle) is transmitted to the slow component 108 during another (e.g., immediately subsequent) slow clock cycle.

For example, referring to FIGS. 4 and 5, the latch 460 receives fast data D1 during the first full fast clock cycle Aa1 in the first slow clock cycle 139a1. During the first full fast clock cycle Aa1, the drive mask signal 140a is enabled, which in turn enables the latch 460. Accordingly, the latch 460 transmits the received fast data D1 to the slow component 108 during the first slow clock cycle 139a1, as illustrated in FIG. 5.

Any fast data received by the latch 460 during any other fast clock cycles (e.g., any one of the second, third or fourth fast clock cycles in the first slow clock cycle 139a1, as illustrated in FIG. 5) is held by the latch 460. For example, fast data D2 received by the latch 460 during the fourth fast clock cycle is held by the latch 460, and transmitted to the slow component 108 as slow data 158 during the second slow clock cycle 139a2.

In one embodiment, transmitting the fast data 154 received during the first full fast clock cycle, and refraining (e.g., postponing) transmission of the fast data 154 received during any other fast clock cycles allow relatively large propagation time of the data in the slow clock domain. That is, the slow data can propagate in the slow clock domain (e.g., to the slow component 108) during almost an entire slow clock cycle if the slow data is received during a first full fast clock cycle. In contrast, if the fast data received during, for example, the third fast clock cycle of FIG. 5 were to be immediately transmitted by the latch 460 to the slow clock domain, the data would have been transmitted only for a portion of the first slow clock cycle 139a1, thereby allowing relatively smaller propagation time for the data to propagate in the slow clock domain side.

Such selective transmission by the latch 460 does not adversely affect a latency of the system 100, as each of the slow clock cycles may transmit slow data 158. Thus, the data transfer speed between the fast component 104 and the slow component 108 may be as high as the clock speed of the slow clock 138.

In one embodiment, the fast valid signal 144 is enabled when the fast data 154, which is transmitted to and/or received by the fast component 104, is valid. In one embodiment, the fast ready signal 146 is enabled when the fast component 104 is ready for transmission and/or ready for reception of fast data 154. A data transfer contract is signed by the fast component 104 when both the fast ready signal 146 and the fast valid signal 144 are enabled. For example, the contract is signed by the fast component 104 when the fast component 104 is ready for data reception (e.g., when the fast ready signal 146 is enabled) and when the data received by the fast component 108 is valid (e.g., when the fast valid signal 144 is enabled). Put differently, the fast ready signal 146 has to meet the fast valid signal 144 for the contract in the fast clock domain to be signed.

Similarly, in one embodiment, the slow valid signal 148 is enabled when the slow data 158, which is transmitted to and/or received by the slow component 108, is valid. In one embodiment, the slow ready signal 150 is enabled when the slow component 108 is ready for transmission and/or ready for reception of slow data 158. A contract is signed by the slow component 108 when both the slow ready signal 150 and the slow valid signal 148 are enabled. For example, the contract is signed by the slow component 108 when the slow component 108 is ready for data reception (e.g., when the slow ready signal 150 is enabled) and when the data received by the slow component 108 is valid (e.g., when the slow valid signal 148 is enabled). Put differently, the slow ready signal 150 has to meet the slow valid signal 148 for the contract in the slow clock domain to be signed.

For data transfer between the fast component 104 and the slow component 108 to be valid and complete, contracts have to be signed in both the slow clock domain and the fast clock domain (e.g., signed in both the clock domains at substantially the same time). Signature of such a contract, by both the slow and fast clock domains, signifies successful completion of data transfer between the two clock domains. In one embodiment, subsequent to transferring data between the fast component 104 and the slow component 108, an end check of the data transfer is performed, where the data transfer is considered as valid and complete in the case contracts are signed by both the fast clock domain and the slow clock domain.

Referring again to FIGS. 4 and 5, the latch 462 receives the fast valid signal 144 from the fast component 104. The fast valid signal 144 signifies that the fast data 154, received by the latch 460, is valid data. In one embodiment, latches 460 and 462 are both controlled by the drive mask signal 140, and latches 460 and 462 operate at least in part in a similar manner. For example, fast valid signal 144 received by the latch 462 during a first full fast clock cycle (e.g., first fast clock cycle Aa1 of FIG. 5) is transmitted as slow valid signal 148 to the slow component 108 during the slow clock cycle in which the first full fast clock cycle was received (e.g., during the first slow clock signal 139a1). Fast valid signal 144 received by the latch 460 during any other fast clock cycle (i.e., any fast clock cycle other than a first full fast clock cycle, e.g., during the fourth fast clock cycle of FIG. 5) is transmitted to the slow component 108 as slow valid signal 148 during another (e.g., immediately subsequent) slow clock cycle (e.g., the second slow clock cycle 139a2). Thus, fast valid signal 144 associated with fast data 154 is transmitted as slow valid signal 148 to the slow component 108 only when the associated fast data 154 is transmitted to the slow component 108 as slow data 158.

When the slow component 108 is ready to receive the slow data 158, the slow component enables the slow ready signal 150. If the slow component 108 receives the slow data 158 during this time (i.e., while the slow ready signal 150 is enabled), a contract is signed in the slow clock domain.

The slow ready signal 150 is received by latch 464, which is controlled by the sample hold mask signal 151. That is, the latch 464 transmits the slow ready signal 150 to the fast clock domain only when the sample hold mask signal 151 is enabled. The output of the latch 464 is labeled as signal A.

The AND logic gate 468 performs a logical AND operation of signal A, signal AA (which is an output of the OR logic gate 466) and the sample cut mask signal 153, and outputs the fast ready signal 146.

In a case where the ratio between the slow and fast clock signals is less than 1:2 (e.g., when the ratio is 3:5, 2:3, 1:1, or the like, i.e., when there is a single full fast clock cycle encapsulated within a single slow clock cycle, and the single full fast clock cycle acts both as first fast full clock cycle and as last fast full clock cycle), the slow valid signal 148 may try to propagate from the fast clock domain to the slow clock domain, and back to the fast clock domain—all in the same fast clock cycle. This is because, the full fast clock cycle acts both as the first and last fast full cycle within the slow clock cycle. Hence, having the drive and sample masks asserted at the same fast clock cycle enables a timing path of the fast valid signal 144 through the slow valid signal 148, and back to the fast ready signal 146. This may be the case only for clock cycle ratios less than 1:2 (because, for ratios of 1:2 or more, the first and last full fast cycles in a slow cycle are different fast clock cycles). For preventing such timing issues in systems with clock ratios of less than 1:2, a slow_disconnect signal is introduced, (e.g., based on device configuration or clock cycle ratios) as illustrated in FIG. 4. When the slow_disconnect signal is active, the signal is OR'ed using the OR logic gate 466, which blocks the feedback of the slow-valid signal 148 into the generation of the fast ready signal 146, thereby maintaining the functionality of the system 400 and solving the timing path issues as well.

As previously discussed and illustrated in FIG. 3, the sample hold mask signal 151 begins around the beginning of the last full fast clock cycle and ends before the end of the last full fast clock cycle. In various embodiments, sample hold mask signal 151 may start earlier (e.g., not illustrated in FIG. 3), at about the same time (e.g., as illustrated in FIG. 3), or later than (e.g., not illustrated in FIG. 3) the sample cut mask 153 (as long as it starts within the slow clock cycle period). The sample hold mask signal 151 ends following the falling edge of the last full fast clock cycle, but still before the next rising edge of the next fast clock cycle. Also, the sample cut mask signal 153 begins after the beginning of the last full fast clock cycle, and ends after the end of the last full fast clock cycle. Accordingly, the fast ready signal 146 is enabled, by the AND gate 468, when the slow valid signal 148 is enabled, the slow ready signal 150 is enabled, and when both the sample cut mask signal 153 and the sample hold mask signal 151 are enabled.

For example, FIG. 5 illustrates the slow ready signal 150, which is enabled during the first slow clock cycle 139a1 and the second slow clock cycle 139a2 based on the slow component 108 being ready to receive slow data 158 (e.g., slow data D1 and D2, respectively) during these two clock cycles. Also, although not illustrated in FIG. 5, the slow valid signal 148 is enabled during the first slow clock cycle 139a1 and second slow clock cycle 139a2 in response to receiving the fast valid signal 144 during both these clock cycles. Thus, the fast ready signal 146 is generated by the AND gate 468 based on the sample cut mask signal 153 and the sample hold mask signal 151 (i.e., when both the sample cut mask signal 153 and the sample hold mask signal 151 are enabled, see FIG. 3). Accordingly, the fast ready signal 146 is enabled at least during a portion of the last full fast clock cycles in the first and second slow clock cycles 139a1 and 139a2, as illustrated in FIG. 5.

Thus, although the slow ready signal 150 is enabled during an entire slow clock cycle (which is equivalent to about four fast clock cycles), by using the latch 464 followed by the AND gate 468, the fast ready signal 146 is enabled for only one fast clock cycle (but not for all the four fast clock cycles). Accordingly, the fast component 104 sees the fast ready signal 146 being enabled for only one fast cycle (e.g., instead of four fast clock cycles) for each slow clock cycle the slow ready signal 150 is enabled. This ensures that a single and same contract is signed by both the clock domains. Without such latching by the latch 464 followed by the AND gate 468, the fast clock domain would have seen a series of fast ready assertion for a single slow ready assertion, possible leading to signing multiple contract in the fast clock domain for a single contract in the slow clock domain. Thus, the AND gate 468 cuts the slow clock domain signals (e.g., the slow valid signal 148 and/or the slow ready signal 150) to a single pulse of the fast clock, using the sample cut mask signal 153. The latch 464, using the sample hold mask signal 151, enables flexible timing adjustments.

By using the AND gate 468, the fast ready signal 146 is enabled at least when both the slow valid signal 148 and the slow ready signal 150 are enabled (i.e., when a contract is signed in the slow clock domain).

Using the sample cut mask signal 153 and the sample hold mask signal 151 in system 100 of FIG. 4 (e.g., instead of using the sample mask signal 142 of FIGS. 1, 2a and 2b) helps ensure that the fast ready signal 146 exists during the last full fast clock in the slow clock cycle, envelopes the sampling fast clock edge, and provides flexibility for compensating the required timing margins between the slow and fast clock domains. That is, there is a margin between an end of the sample hold mask signal 151 and an end of the last full fast clock cycle. Such a margin helps ensure that even if the two clock signals are not fully synchronized, the fast ready signal 146 always envelopes the next fast clock cycle sampling point. Thus, such a margin helps in avoiding signing of two contracts in the fast clock domain for a single contract in the slow clock domain.

Figure 6:
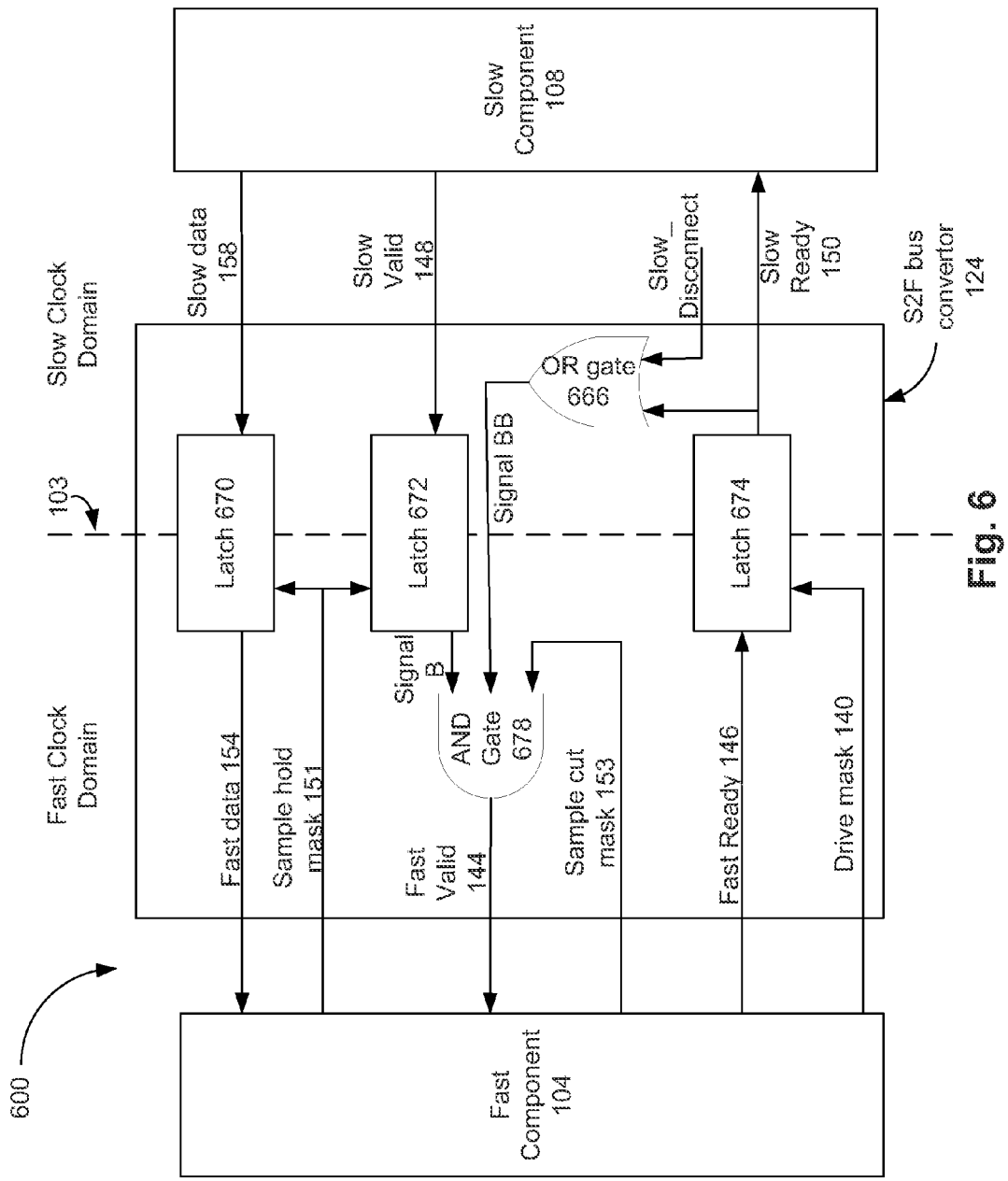
FIG. 6 schematically illustrates a system that includes a slow-to-fast bus convertor, in accordance with an embodiment of the present disclosure.

FIG. 6 schematically illustrates a system 600 that includes a S2F bus convertor 124, in accordance with an embodiment of the present disclosure. The system 600 of FIG. 6 is in part similar to the system 100 of FIG. 1. However, although the S2F bus convertor 124 is included in the interface 120 in system 100 of FIG. 1, the interface 120 is not illustrated in FIG. 6 for the purpose of clarity and to not obfuscate the principle teachings of this disclosure. For similar reasons, the F2S bus convertor 122, the F2S pulse convertor 126, the fast clock signal generator 114, and the slow clock signal generator 118 of FIG. 1 are also not illustrated in FIG. 6.

Similar to FIG. 4, the system 600 of FIG. 6 is divided in two clock domains by a dotted line 103. The left domain of the dotted line 103 is labeled as fast clock domain, and the right domain of the dotted line 103 is labeled as slow clock domain.

Figure 7:
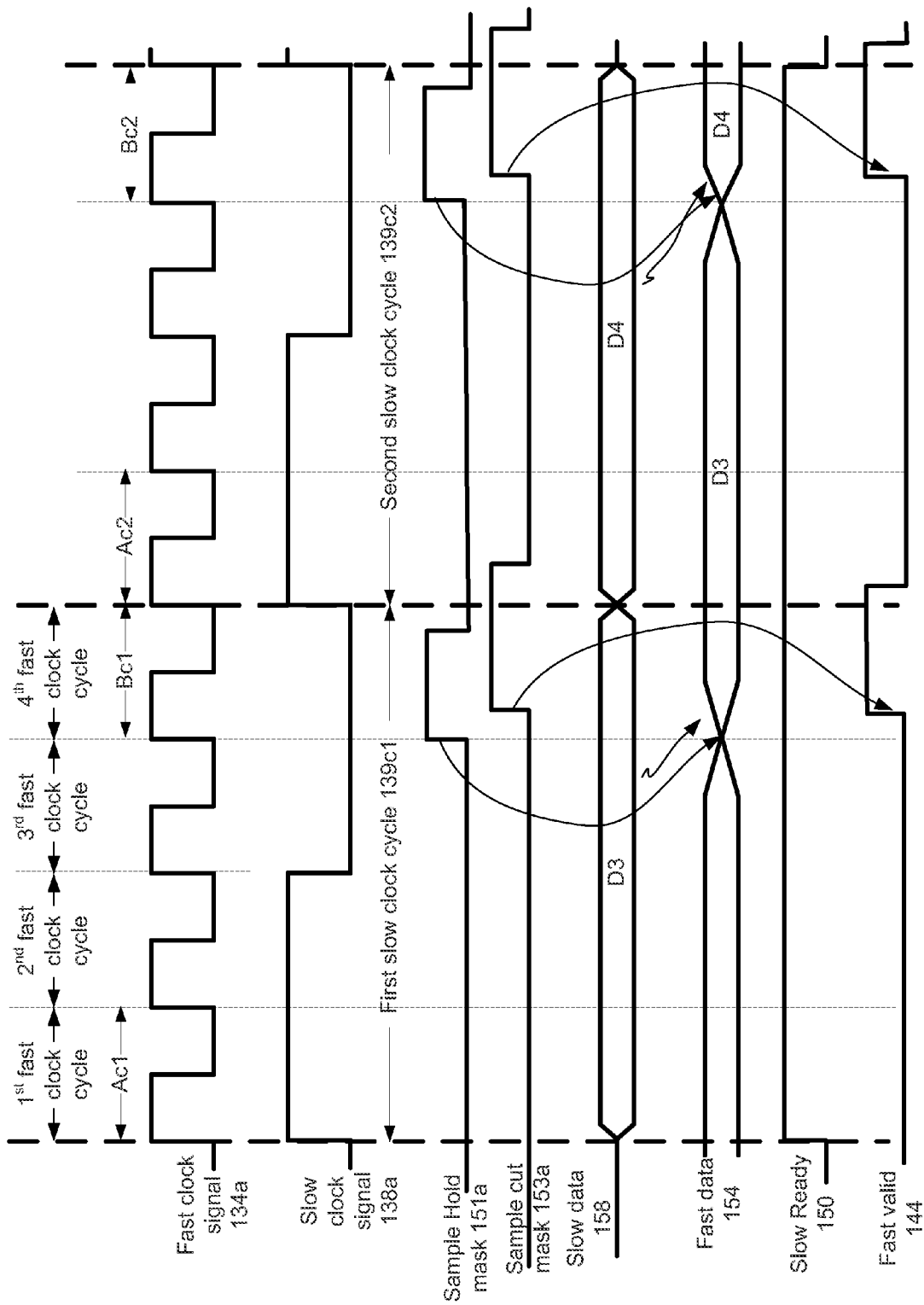
FIG. 7 illustrates example timing diagrams of various signals associated with one or more components of the system of FIG. 6, in accordance with an embodiment of the present disclosure.

FIG. 7 illustrates example timing diagrams of various signals associated with one or more components of the system 600 of FIG. 6, in accordance with an embodiment of the present disclosure. The timing diagrams in FIG. 7 are at least in part similar to those in FIG. 2a. However, in addition to the timing diagrams of FIG. 2a, FIG. 7 includes example timing diagrams of the fast data 154 and slow data 158.

Referring again to FIG. 6, the S2F bus convertor 124 includes latches 670, 672 and 674, a logic OR gate 666, and a logic AND gate 678. The latch 670 receives slow data 158 from the slow component 108, and selectively transmits the received slow data 158 to the fast component 104 based at least in part on the sample hold mask signal 151 received from the fast component 104. For example, the latch 670 transmits the received slow data 158 to the fast component 104 only when the sample hold mask signal 151 is enabled. Thus, the latch 670 transmits the received slow data 158 to the fast component 104 during one or more of the last full fast clock cycles (as the sample hold mask signal 151 is enabled during at least a part of the last full fast clock cycles, as previously discussed and illustrated in FIG. 3).

Any slow data 158 received by the latch 670 during a slow clock cycle is transmitted (e.g., transmitted as fast data 154) to the fast component 104 during the associated last full fast clock cycle. For example, referring to FIGS. 6 and 7, the latch 670 receives slow data D3 during a first slow clock cycle 139c1. During a part of an associated last full fast clock cycle Bc1 (e.g., from the beginning of the last full fast clock cycle Bc1), the sample hold mask signal 151a is enabled, which in turn enables the latch 670. Accordingly, the latch 670 starts propagating the received slow data D3 to the fast component 104 from the beginning of the last full fast slow clock cycle Bc1 (i.e., from about the time the sample hold mask signal 151a is enabled), as illustrated in FIG. 7. The latch 670 latches the data D3 in the fast clock domain until assertion of the next sample hold mask signal 151a (which happens, for example, from the beginning of the period Bc2). That is, data D3 is maintained from a raising edge of the sample hold mask signal 151a to an immediate next rising edge of the sample hold mask signal 151a. During the immediate next rising edge of the sample hold mask signal 151a, data D3 is replaced by data D4, as illustrated in FIG. 7. The latch 670 maintains the data in the fast clock domain between the two consecutive rising edges of the sample hold mask signal 151a. Transmission of data D3 to the fast clock domain is not started during any other fast clock cycles in the slow clock cycle (other than the last full fast clock cycle), being qualified by the accompanying fast valid signal 144. For example, start of transmission of the data D3 to the fast clock domain is not started during first and second fast clock cycles.

Similarly, the latch 670 receives slow data D4 during a second slow clock cycle 139c2. During a part of an associated last full fast clock cycle Bc2, the sample hold mask signal 151a is enabled, which in turn enables the latch 670. Accordingly, the latch 670 transmits the received slow data D4 to the fast component 104 during at least a portion of the last full fast slow clock cycle Bc1, as illustrated in FIG. 7.

In one embodiment, transmitting the slow data 158 to the fast clock domain during a part of the last full fast clock cycle has several advantages. For example, this may allow relatively large propagation time of the data in the slow clock domain. That is, the slow data can propagate in the slow clock domain (e.g., from the slow component 108 to the latch 670) during almost an entire slow clock cycle, before the data is being propagated by the latch 670 to the fast clock domain.

In one embodiment, for each slow clock cycle data may be transmitted to the fast domain. Accordingly, such selective transmission by the latch 670 does not adversely affect a latency of the system 600. The data transfer rate between the fast component 104 and the slow component 108 may be as high as the clock speed of the slow clock 138.

Referring again to FIGS. 6 and 7, the latch 672 receives the slow valid signal 148 from the slow component 108, and selectively outputs a signal B. The slow valid signal 148 signifies that the slow data 158, received by the latch 670, is valid data. In one embodiment, latches 670 and 672 are both controlled by the sample hold mask signal 151, and latches 670 and 672 operate at least in part in a similar manner. For example, slow valid signal 148 received by the latch 672 during a slow clock cycle (e.g., the first slow clock cycle 139c1 of FIG. 7) is transmitted as signal B during at least part of the associated last full first clock cycle Bc1 (i.e., while the sample hold mask signal 151 is enabled).

When the fast component 104 is ready to receive the fast data 154, the fast component enables the fast ready signal 146. In one embodiment, the fast ready signal 146 is received by latch 674, which is controlled by the drive mask signal 140. That is, the latch 674 transmits the fast ready signal 146 to the slow clock domain only when the drive mask signal 140 is enabled. As the drive mask signal is enabled during the first full fast clock cycles, the fast ready signal 146 is propagated to the slow clock domain during the first full clock cycle in a slow clock cycle, and is enabled during the entire slow clock cycle.

Thus, although the fast ready signal 146 may be enabled for a plurality of fast clock cycles (e.g., the first, second, third and fourth clock cycles of FIG. 7), the slow ready signal 150 is enabled during only one slow clock cycle (e.g., the first slow clock cycle 139c1) associated with the plurality of fast clock cycles. Accordingly, the slow component 108 sees the slow ready signal 150 being enabled for only one slow cycle (e.g., instead of a number of slow clock cycles) even though the fast ready signal 146 may be enabled for more than one corresponding fast clock cycles. This ensures that a single and same contract is signed by both the clock domains.

The AND gate 678 performs a logical AND operation of signal B, the signal BB (i.e., output of the OR logic gate 666) and the sample cut mask signal 153, and outputs the fast valid signal 144.

In a case where the ratio between the slow and fast clock domains is less than 1:2 (e.g., when the ratio is 3:5, 2:3, 1:1, or the like, i.e., when there is a single full fast clock cycle encapsulated within a single slow clock cycle, and the single full fast clock cycle acts both as first fast full clock cycle and as last fast full clock cycle), there may be a timing issue of the slow ready signal 150 being transmitted back into AND gate 678, leading to a timing path of the fast ready signal 146 through slow ready signal 150, back into fast valid signal 144—all in the same fast clock cycle. Accordingly, similar to the OR gate 466 in FIG. 4, the OR gate 666 is introduced in FIG. 6 between the slow ready signal 150 and the AND gate 678. While the clock ratio is less than 1:2, the slow_disconnect signal is OR'ed with the slow ready signal 150 using the OR Gate 680. The OR gate 680 blocks the round trip path, thereby preventing the feedback of slow ready signal 159 back into the fast domain.

As previously discussed and illustrated in FIG. 3, the sample hold mask signal 151 begins about simultaneously with the beginning of the last full fast clock cycle and ends before the end of the last full fast clock cycle. Also, the sample cut mask signal 153 begins after the beginning of the last full fast clock cycle, and ends after the end of the last full fast clock cycle. Accordingly, the fast valid signal 144 is enabled, by the AND gate 678, when the slow ready signal 150 is enabled, the slow valid signal 148 is enabled, and when both the sample cut mask signal 153 and the sample hold mask signal 151 are enabled.

For example, FIG. 7 illustrates the slow ready signal 150, which is enabled during the first slow clock cycle 139a1 and the second slow clock cycle 139a2 based on receiving the fast ready signal 146 through the latch 674 during these two clock cycles. Also, although not illustrated in FIG. 7, the slow valid signal 148 is enabled during the first slow clock cycle 139a1 and second slow clock cycle 139a2 in response to transmitting valid slow data D3 and D4 during these two clock cycles. Thus, the fast valid signal 144 is generated by the AND gate 678 based on the sample cut mask signal 153 and the sample hold mask signal 151 (i.e., when both the sample cut mask signal 153 and the sample hold mask signal 151 are enabled, see FIG. 3). Accordingly, the fast valid signal 144 is enabled at least during a portion of the last full fast clock cycles in the first and second slow clock cycles 139c1 and 139c2, as illustrated in FIG. 7.

By using the AND gate 678, the fast valid signal 144 is enabled at least when both the slow valid signal 148 and the slow ready signal 150 are enabled (i.e., when a contract is signed in the slow clock domain).

Using the sample cut mask signal 153 and the sample hold mask signal 151 in system 600 of FIG. 6 (e.g., instead of using the sample mask signal 142 of FIGS. 1, 2a and 2b) helps ensure that the fast valid signal 144 exists during the last full fast clock in the slow clock cycle, envelopes the sampling fast clock edge, and provides flexibility for compensating the required timing margins between the slow and fast clock domains. That is, there is a margin between an end of the sample hold mask signal 151a and an end of the last full fast clock cycle. Such a margin helps ensure that even if the fast and slow clock signals are not fully synchronized, the fast data signal 154 and preparation for the fast valid signal 144 are always ready for exactly a single usage before the next rising edge of a slow clock cycle and fast clock cycle. Thus, such a margin helps in avoiding signing of two contracts in the fast clock domain for a single contract in the slow clock domain.

When the fast component 104 receives the fast valid signal and also has the fast ready signal enabled, a contract is signed in the fast clock domain.

Figure 8:
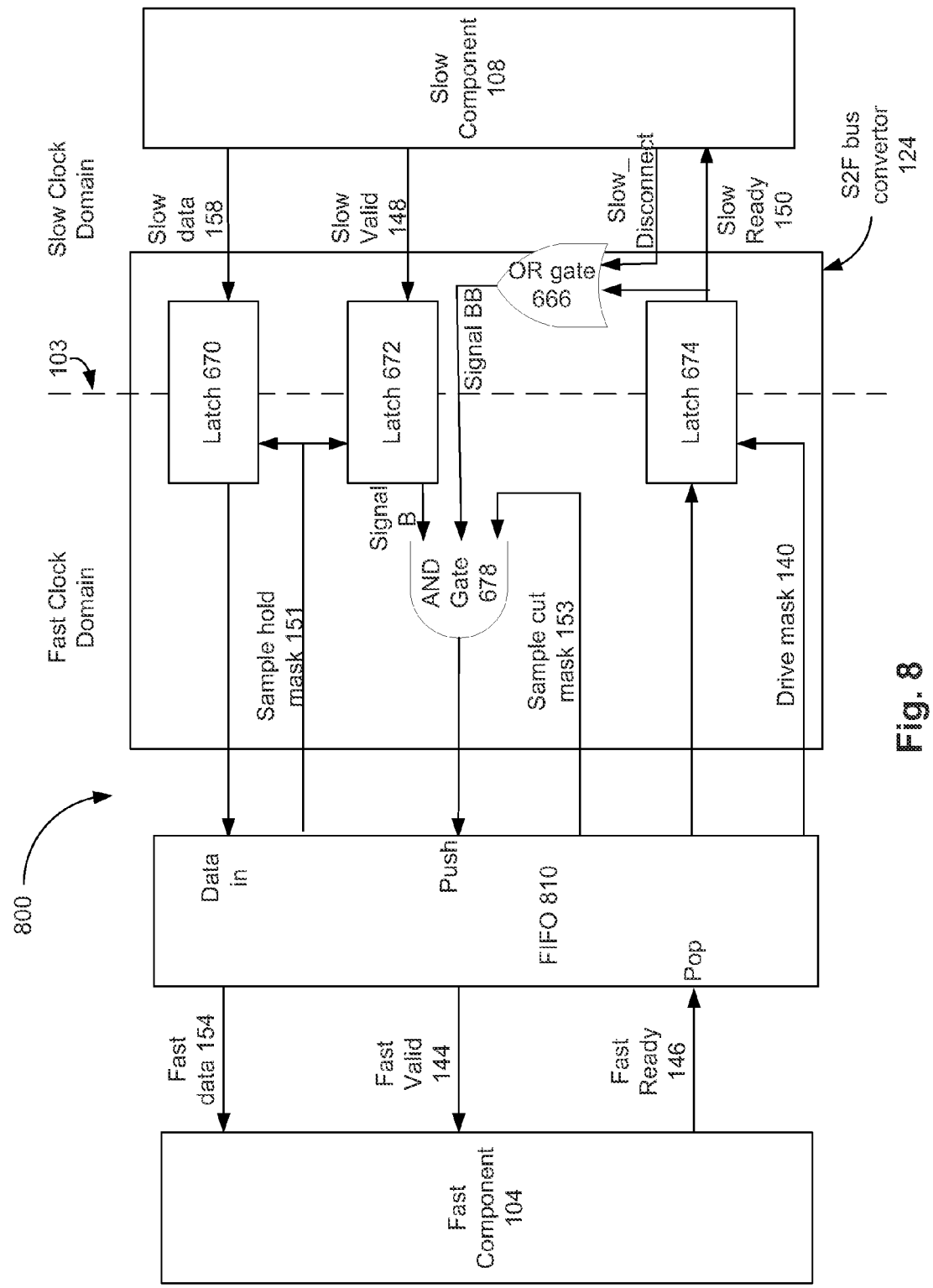
FIG. 8 schematically illustrates a system in which the slow-to-fast bus convertor of FIG. 6 is operatively coupled to a fast component through a first in-first out (FIFO), in accordance with an embodiment of the present disclosure.

FIG. 8 schematically illustrates a system 800, in which the S2F bus convertor 124 of FIG. 6 is operatively coupled to the fast component 400 through a first in-first out (FIFO) 810, in accordance with an embodiment of the present disclosure. In one embodiment, the FIFO 810 is a single entry FIFO register or a single entry FIFO queue.

Various components of the system 800 are in part similar to the corresponding components of FIG. 6. However, unlike the system 600, in the system 800 an output of the latch 670 is transmitted as fast data to the fast component 104 through the FIFO 810. Also, an output of the AND gate 678 is transmitted as fast valid signal 144 to the fast component through the FIFO 810. Furthermore, the fast ready signal 146 is transmitted from the fast component 104 to the latch 674 through the FIFO 810.

In various bus architectures and associated protocols (e.g., ADVANCED EXTENSIBLE INTERFACE (AXI) PROTOCOL® associated with ADVANCED MICROCONTROLLER BUS ARCHITECTURE (AMBA)®, developed by ARM HOLDINGS® of Cambridge, England), a valid signal (e.g., the fast valid signal 144 and/or the slow valid signal 148) cannot depend on an existence of a ready signal (e.g., the fast ready signal 146 and/or the slow ready signal 150). Because of such restrictions, in the case the FIFO 810 is absent from the system 800, a deadlock situation may arise during which the fast ready signal 146 depends on fast valid signal 144, thereby preventing assertion of the fast ready signal 146 independent of assertion of fast valid signal 144. In one embodiment, the buffering by the FIFO 810 breaks the dependency of the fast valid signal 144 on the fast ready signal 146 and/or on the slow ready signal 150. Thus, the FIFO 810 ensures that the system is 800 is compatible with such bus architectures and associated protocols.

In one embodiment, if such restrictions on the valid and ready signals do not exist, the FIFO 810 may be eliminated from the system 800.

In one embodiment, the FIFO 810 includes a bypass for push direction in path of the fast valid signal 144, thereby enabling zero latency from data arrival to submission forward. In an embodiment, if the assertion of a fast valid signal 144 has no dependency on the fast ready signal 146, the system 800 may be used without adding the FIFO 810 (e.g., similar to system 600 of FIG. 6). The extended system 800 (i.e., with the FIFO 810) may be configured, if desired, to bypass the FIFO 810, drop the FIFO 810, or bypass data forwarding from incoming to outgoing direction on account of minor direct path timing, without extra registration by the FIFO 810. Thus, the bypass for the push direction in the path of the fast valid signal 144 may result in no additional cycle latency, while still exercising the FIFO characteristic of breaking direct dependency of valid signal on ready signal.

FIG. 9a schematically illustrates a system 900 that includes a F2S pulse convertor 126, in accordance with an embodiment of the present disclosure. The system 900 of FIG. 9a is in part similar to the system 100 of FIG. 1. However, although the F2S pulse convertor 126 is included in the interface 120 in system 100 of FIG. 1, the interface 120 is not illustrated in FIG. 9a for the purpose of clarity and to not obfuscate the principle teachings of this disclosure. For similar reasons, the F2S bus convertor 122, the S2F bus convertor 124, the fast clock signal generator 114, and the slow clock signal generator 118 of FIG. 1 are also not illustrated in FIG. 9a.

Similar to FIG. 4, the system 900 of FIG. 9a is divided in two domains by a dotted line 105. The left domain of the dotted line 105 is labeled as fast clock domain, and the right domain of the dotted line 105 is labeled as slow clock domain.

In FIG. 4, the fast data 154 (e.g., data D2 in FIG. 5) may be transmitted by the fast component 104 to the latch 460 during a fast clock cycle other than the first full fast clock cycle. Such data may be re-transmitted by the fast component 104 during the next first full fast clock cycle and or may be held by the latch 460 until the next first full fast clock cycle.

However, unlike the fast data discussed with respect to FIG. 4, a pulse may be asserted for a single fast clock cycle, and may be required to be detected for a full slow clock at the slower domain. Such pulses are common in various bus architectures and associated protocols (e.g., AXI PROTOCOL® associated with AMBA®, developed by ARM HOLDINGS®). Because of reasons previously discussed, it may be desirable to transmit such pulses from the fast clock domain to the slow clock domain only during first full fast clock cycles, even if such pulses are received during any fast clock cycles other then the first full fast clock cycles. Also, in one embodiment, such pulses may not be re-transmitted by the fast component 104.

Accordingly, it may be desirable to accumulate or store one or more pulses in the fast clock domain (e.g., in the case the one or more pulses are received during one or more fast clock cycles other than a first full fast clock cycle, or a series of pulses is received but not yet propagated in the slow clock domain), and transmit the accumulated pulses to the slow clock domain during one or more subsequent first full fast clock cycles of consecutive slow clock cycles, until all pulses have been transmitted to the slow clock domain.

In one embodiment, the F2S pulse convertor 124 includes latch 988, a logical OR gate 980, and a counter 984. The latch 988 is controlled by a drive mask signal 942, while the counter 984 is controlled by another drive mask signal 944, as illustrated in FIG. 9a. In an embodiment, the drive mask signals 942 and 944 may be at least in part similar to the drive mask signal 140 of FIGS. 1-8. However, the drive mask signal 942 may be asserted for the entire full fast clock cycle (e.g., similar to the drive mask signal 140 of FIG. 3) or may be clock-gated (e.g., asserted for a period shorter than a full fast clock cycle, i.e., de-asserted before the end of the full fast clock cycle). On the other hand, the drive mask signal 944 is asserted for the entire full fast clock cycle (e.g., similar to the drive mask signal 140 illustrated in FIG. 3).

If the pulse is transmitted, in the form of fast data 154, during a first full fast clock cycle, the latch 988 receives the pulse through the OR gate 980. Also, during the first full fast clock cycle, the drive mask signal 942 is enabled, which in turn enables the latch 988 to propagate the received pulse to the slow clock domain during the first full fast clock cycle. Thus, any pulse transmitted by the fast component 104 to the latch 988 during the first full fast clock cycle is immediately propagated by the latch 988 to the slow clock domain.

However, in the case one or more pulses are received during any other fast clock cycle (e.g., the second fast clock cycle, third fast clock cycle, etc. of FIG. 2*a*), the latch 988 cannot immediately transmit the pulse to the slow clock domain (as the drive mask signal 942 is disabled during the second fast clock cycle). However, the pulses are accumulated in the counter 984, and are available for propagation to the slow domain at the next available slot(s) (e.g., the subsequent first full fast clock cycle(s)).

The counter 984 is incremented (i.e., +1 is added to the counter) if a pulse from the fast domain is received, and the drive mask signal 944 is disabled (i.e., not asserted). On the other hand, the counter 984 is decremented (i.e., −1 is added to the counter) if no pulse is received from the fast domain, and the drive mask signal 944 is enabled (i.e., asserted). In the case a pulse is received and the drive mask signal 944 is enabled (or if no pulse is received and the drive mask signal 944 is disabled), the count value of the counter 984 is maintained (i.e., the count value does not change). The counter 984 reports a saturation condition to the fast component 104 if the count value reaches a maximum count value. In such a case, if the fast component 104 continues transmitting pulses to the F2S pulse convertor 126, such pulses may be lost.

In an embodiment, the counter 984 ensures that if N number (N being an integer) of pulses (e.g., N number of series of pulses) are received from the fast clock domain, the N number of pulses will be propagated in the slow domain in N number of slow clock cycles, with all applicable restrictions of the pulses also being transmitted to the slow clock domain.

As the OR gate 980 and the counter 984 accumulate or store the pulse during one or more fast clock cycles, these components collectively form an accumulator 990 (illustrated by dotted line in FIG. 9*a*).

In an embodiment, the S2F bus converter 124 of FIG. 6 may be used for converting a slow domain pulse to a fast domain pulse. That is, unlike a dedicated F2S pulse convertor of FIG. 9*a*, in an embodiment, a dedicated S2F pulse convertor may not be needed to convert a slow domain pulse to a fast domain pulse. However, in another embodiment, a simplified circuit (e.g., simpler than the S2F bus converter 124 of FIG. 6) is used to convert a slow domain pulse to a fast domain pulse.

Figure 9B:
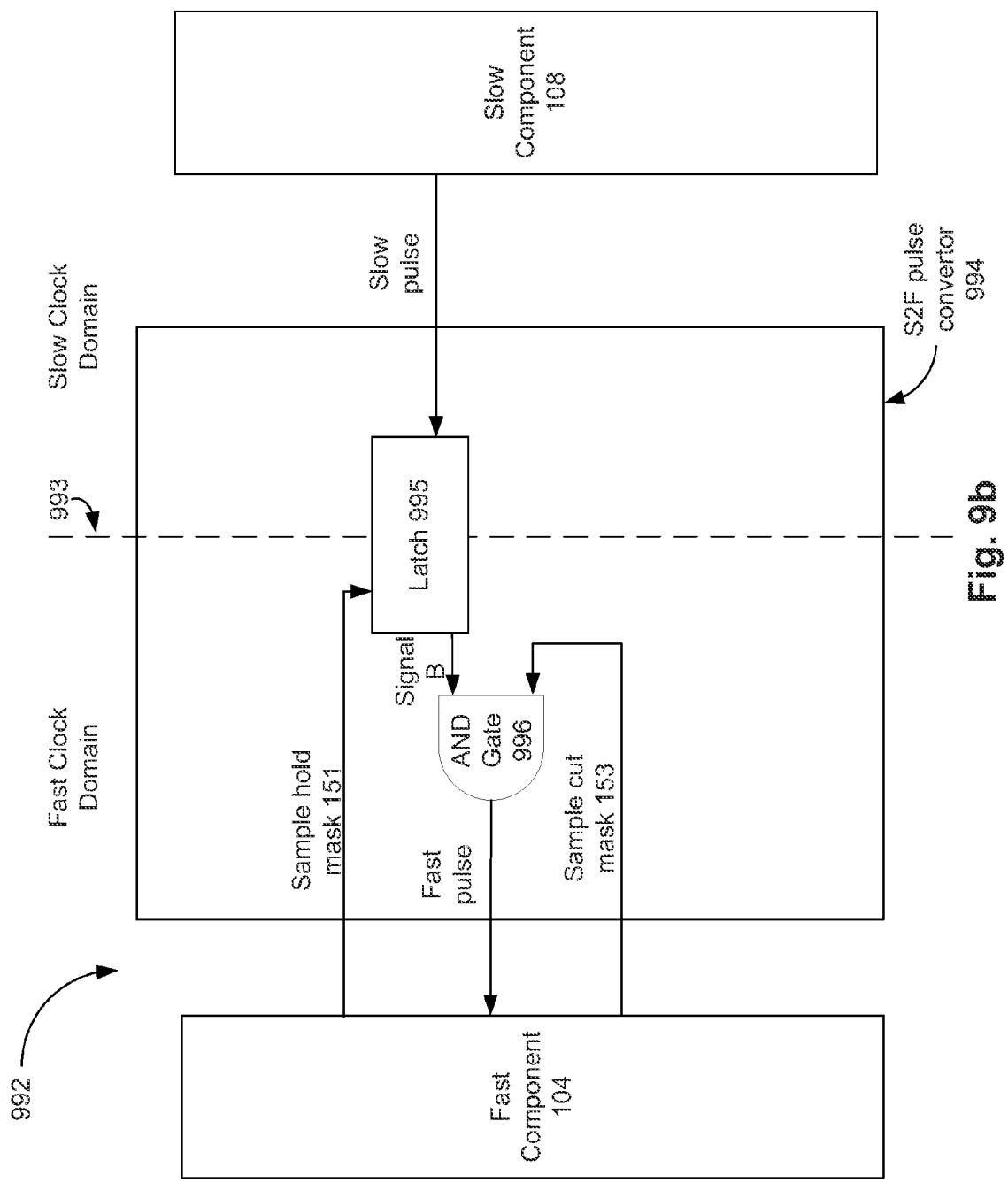
FIG. 9b schematically illustrates a system that includes a S2F pulse convertor, in accordance with an embodiment of the present disclosure.

FIG. 9*b* schematically illustrates a system 992 that includes a S2F pulse convertor 994, in accordance with an embodiment of the present disclosure. Although the S2F pulse convertor 994 of FIG. 9*b* is not illustrated in the system 100 of FIG. 1, in an embodiment, the S2F pulse convertor 994 of FIG. 9*b* may be present in the system 100 of FIG. 1.

Unlike the accumulation of the fast pulses in FIG. 9*a*, no accumulation of pulses is necessary for the S2F pulse convertor 994. This is because, a pulse received in a slow clock cycle may be transmitted to the fast domain during a last full fast clock cycle in the slow cycle during which the pulse was received.

Similar to FIG. 4, the system 992 of FIG. 9*b* is divided in two clock domains by a dotted line 993. The left clock domain of the dotted line 993 is labeled as fast clock domain, and the right clock domain of the dotted line 993 is labeled as slow clock domain.

The system 992 includes the S2F pulse convertor 994, which includes a latch 995 and a logical AND gate 996. The latch 995 receives the slow pulses from the slow clock domain, and is controlled by the sample hold mask 151. The AND gate 996 receives the output of the latch 995, and also receives the sample cut mask 153. The AND gate 996 outputs the fast pulses to the fast domain.

In an embodiment, the AND gate 678 and the latch 672 of the S2F bus convertor of FIG. 6 may be used as AND gate 995 and latch 995, respectively, in the S2F pulse convertor 994. That is, the S2F pulse convertor 994 may comprise one or more components of the S2F bus convertor 124. Thus, no dedicated S2F pulse convertor may be desired for the system 100 of FIG. 1. The slow and fast pulses may be transmitted through the path of slow valid signal 148 and fast valid signal 144, respectively, of FIG. 6. In an embodiment, the slow_disconnect signal may be disabled while converting slow pulses to fast pulses.

Figure 10:
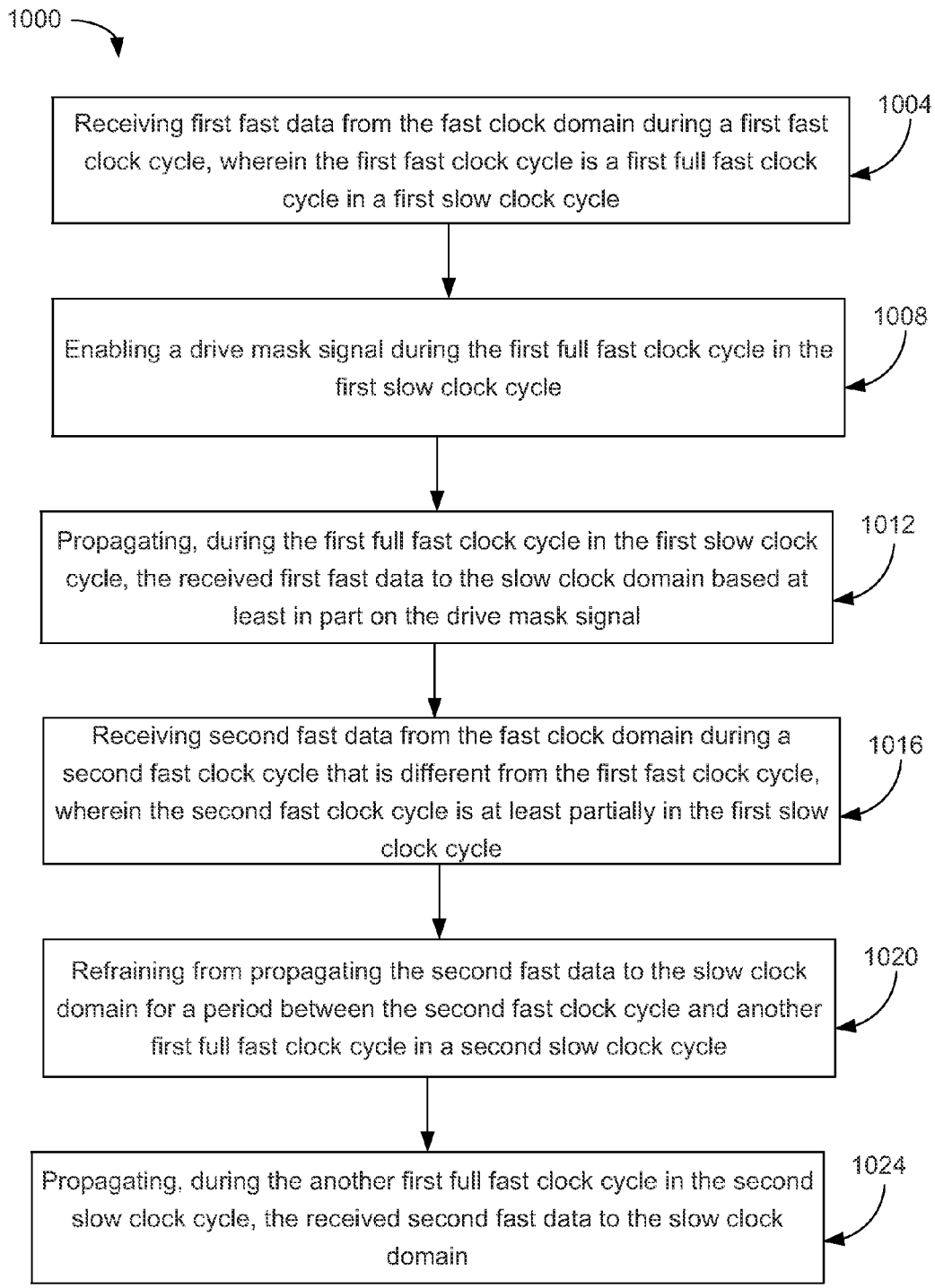
FIG. 10 illustrates a method for operating the system of FIG. 4, in accordance with an embodiment of the present disclosure.

FIG. 10 illustrates a method 1000 for operating the system 100 of FIG. 4, in accordance with an embodiment of the present disclosure. Referring to FIGS. 4, 5 and 10, the method 1000 includes, at 1004, receiving (e.g., by latch 460) first fast data (e.g., data D1) from the fast clock domain during a first fast clock cycle, wherein the first fast clock cycle is a first full fast clock cycle (labeled as Aa1) in a first slow clock cycle (e.g., first slow clock cycle 139*a*1).

The method 1000 further includes, at 1008, enabling (e.g., by fast component 104) a drive mask signal 140 during the first full fast clock cycle in the first slow clock cycle, as illustrated in FIG. 5.

The method 1000 further includes, at 1012, propagating (e.g., by latch 460), during the first full fast clock cycle in the first slow clock cycle, the received first fast data to the slow clock domain based at least in part on the drive mask signal. Thus, as illustrated in FIG. 5, for example, data D1 is propagated in the first slow clock cycle 139*a*1 during the first fast clock cycle.

The method 1000 further includes, at 1016, receiving (e.g., by latch 460) second fast data (e.g., data D2) from the fast clock domain during a second fast clock cycle (e.g., illustrated as the fourth fast clock cycle in FIG. 5) that is different from the first fast clock cycle, where the second fast clock cycle is at least partially in the first slow clock cycle.

The method 1000 further includes, at 1020, refraining (e.g., by latch 460) from propagating the second fast data to the slow clock domain for a period between the second fast clock cycle and another first full fast clock cycle (labeled as Aa2 in FIG. 5) in the second slow clock cycle 139*a*2. For example, as illustrated in FIG. 5, data D2 is not transmitted to the slow domain during the fourth fast clock cycle (i.e., not transmitted until the first full fast clock cycle in the second slow clock cycle 139*a*2).

The method 1000 further includes, at 1024, propagating (e.g., by latch 460), during the another first full fast clock cycle in the second slow clock cycle, the received second fast data D2 to the slow clock domain.

Figure 11:
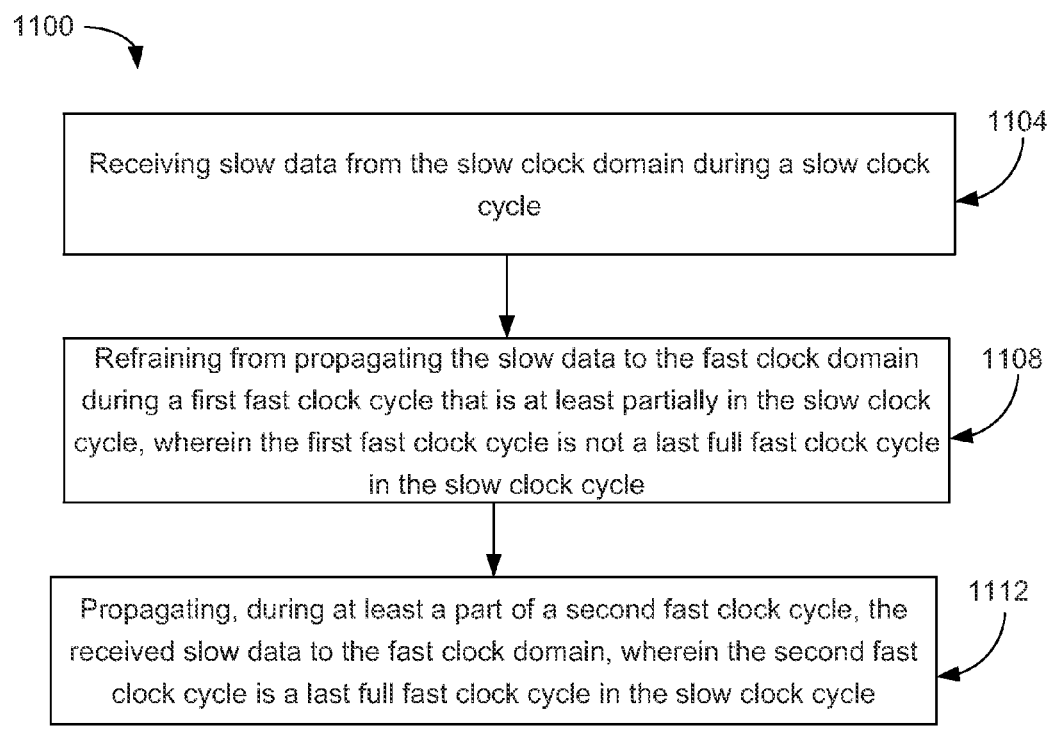
FIG. 11 illustrates a method for operating the systems of FIGS. 6 and/or 8, in accordance with an embodiment of the present disclosure.

FIG. 11 illustrates a method 1100 for operating the systems of FIGS. 6 and/or 8, in accordance with an embodiment of the present disclosure. Referring to FIGS. 6, 7 and 11, the method 1100 includes, at 1104, receiving slow data (e.g., slow data D3) from the slow clock domain during a slow clock cycle (e.g., the first slow clock cycle 139*c*1 of FIG. 7).

The method 1100 further includes, at 1108, refraining from propagating the slow data to the fast clock domain during a first fast clock cycle that is at least partially in the slow clock cycle, wherein the first fast clock cycle is not a last full fast clock cycle in the slow clock cycle. For example, in FIG. 7, the first and second fast clock cycles are not the last full fast clock cycle in the slow clock cycle 139*c*1. Accordingly, the slow data D3 is not propagated to the fast domain, by latch 670, during the first, second and third fast clock cycles.

The method 1100 further includes, at 1112, propagating, during at least a part of a second fast clock cycle, the received slow data to the fast clock domain, where the second fast clock cycle is a last full fast clock cycle in the slow clock cycle. For example, as illustrated in FIG. 7, the fourth fast clock cycle is last full fast clock cycle in the slow clock cycle 139c1. Accordingly, the sample hold mask 151 is enabled during at least a part of the fourth fast clock cycle, based on which the latch 670 propagates the slow data D3 to the fast domain during at least a part of the fourth fast clock cycle. In an embodiment, such propagation of data may be in accordance with the sample hold mask signal, and the fast data may be propagated form the beginning of the last full fast clock cycle, until an occurrence of another last full fast clock cycle. That is, the propagated fast data may be kept stable (e.g., by latch 670) until an assertion of the another last full fast clock cycle of the next slow clock cycle, during which the fast data may be replaced.

Figure 12:
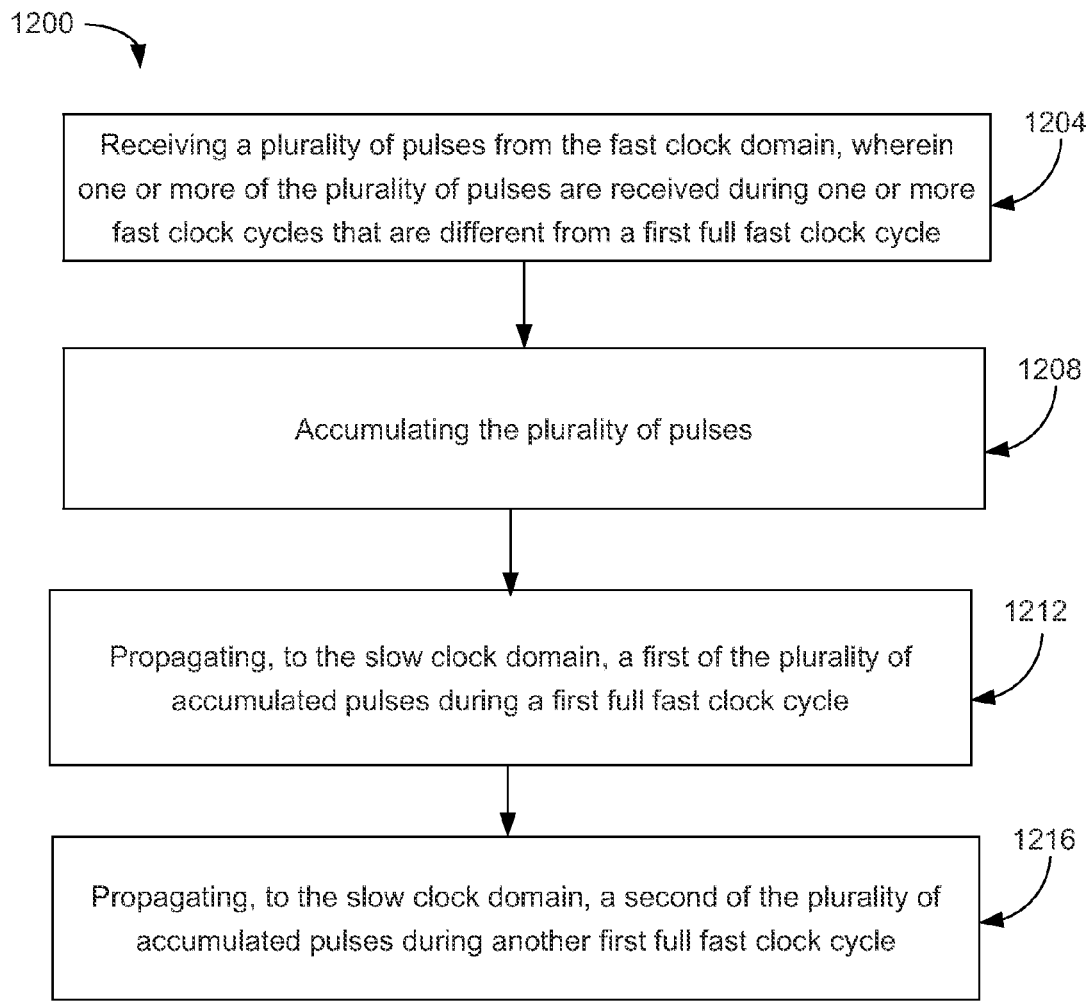
FIG. 12 illustrates a method for operating the system of FIG. 9a, in accordance with an embodiment of the present disclosure.

FIG. 12 illustrates a method 1200 for operating the system of FIG. 9a, in accordance with an embodiment of the present disclosure. Referring to FIGS. 9a and 12, the method 1200 includes, at 1204, receiving (e.g., by the accumulator 990 of FIG. 9a) a plurality of pulses from a fast clock domain, wherein one or more of the plurality of pulses are received during one or more fast clock cycles that are different from a first full fast clock cycle.

The method 1200 further includes, at 1208, accumulating (e.g., by the accumulator 990 of FIG. 9a) the plurality of pulses. For example, the counter 984 may be updated or incremented to accumulate the plurality of pulses.

The method 1200 further includes, at 1212, propagating (e.g., by latch 988), to the slow clock domain, a first of the plurality of accumulated pulses during a first full fast clock cycle. The method 1200 further includes, at 1216, propagating (e.g., by latch 988), to the slow clock domain, a second of the plurality of accumulated pulses during another first full fast clock cycle. Thus, the accumulated pulses are propagated to the slow domain only during first full fast clock cycles. Accordingly, one or more of the accumulated pulses are refrained from propagating to the slow clock domain during a fast clock cycle that is different from a first full fast clock cycle.

Figure 13:
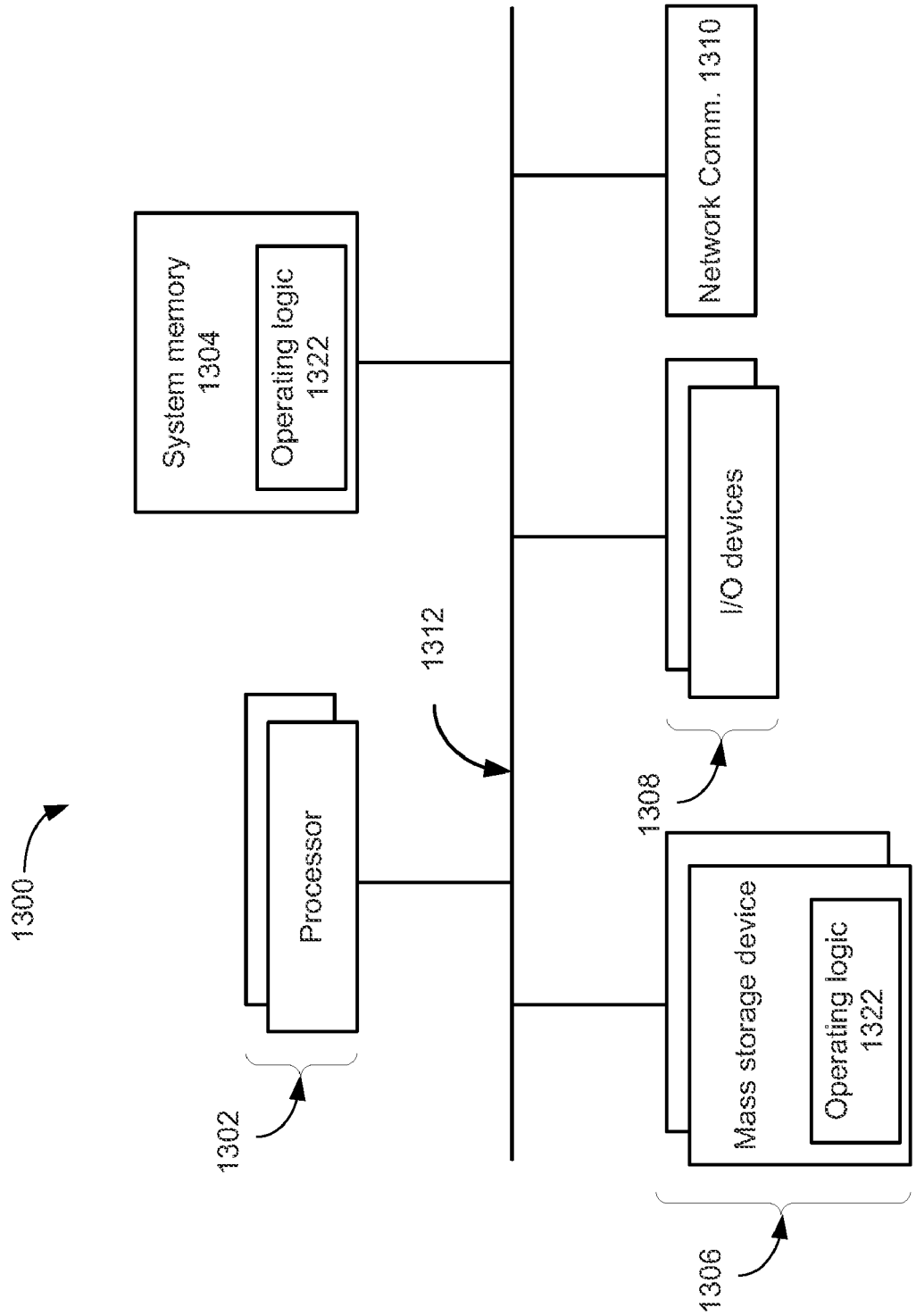
FIG. 13 is a block diagram of an illustrative system suitable for practicing the embodiments of the present disclosure.

FIG. 13 is a block diagram of an illustrative system suitable for practicing the embodiments of the present disclosure. As illustrated, system 1300 includes one or more processors or processor cores 1302, and system memory 1304. For the purpose of this application, including the claims, the terms "processor" and "processor cores" may be considered synonymous, unless the context clearly requires otherwise. Additionally, system 1300 includes mass storage devices 1306 (such as diskette, hard drive, compact disc read only memory (CDROM) and so forth), input/output devices 1308 (such as a display to render visual manifestation, a keyboard, a cursor control, and so forth) and communication interfaces 1310 (such as network interface cards, modems and so forth). The elements of FIG. 13 may be coupled to each other via system bus 1312, which represents one or more buses. In the case of multiple buses, they may be bridged by one or more bus bridges (not illustrated).

In an embodiment, system memory 1304 and mass storage 1306 may be employed to store a working copy and a permanent copy of the programming instructions implementing all or a portion of earlier described functions, herein collectively denoted as 1322. The instructions 1322 may be assembler instructions supported by processor(s) 1302 or instructions that can be compiled from high level languages, such as C or other suitable high level programming languages.

In an embodiment, a permanent copy of the programming instructions is stored into permanent storage 1306 in the factory, or in the field, through, for example, a distribution medium (not shown), such as a compact disc (CD), or through communication interface 1310 (from a distribution server (not shown)). That is, one or more distribution media having instructions 1322 may be employed to distribute the instructions 1322 and program various computing devices.

In various embodiments, one or more components of the system 1300 may function as the fast component 104 of FIGS. 1, 4, 6, 8 and/or 9, and one or more other components of the system 1300 may function as the slow component 108 of FIGS. 1, 4, 6, 8 and/or 9. For example, one or more processors 1302 may be the fast component 104 and any other appropriate component of system 1300 (e.g., a coherency fabric, a DDR controller, and/or the like, not illustrated in FIG. 13) may be the slow component 108. Although not illustrated in FIG. 13, the system 1300 also includes the interface 120 configured to facilitate data transfer between the fast component 104 and the slow component 108. In various embodiments, the instructions in operating logic 1322 may include instructions configured to operate one or more components of the interface 120.

In embodiments of the present disclosure, an article of manufacture (not illustrated) implements one or more methods as disclosed herein. For example, in various embodiments, an article of manufacture may comprise a storage medium and a plurality of programming instructions stored in the storage medium and adapted to program a computing device to configure the computing device to transfer data between a fast clock domain (e.g., the fast component 104) and a slow clock domain (e.g., the slow component 108). In various embodiments, an article of manufacture comprises a storage medium and a plurality of programming instructions stored in the storage medium and adapted to program computing device to configure the computing device to perform one or more operations of the methods 1000, 1100, and/or 1200 of FIGS. 10, 11 and/or 12, respectively.

Although specific embodiments have been illustrated and described herein, it will be appreciated by those of ordinary skill in the art and others, that a wide variety of alternate and/or equivalent implementations may be substituted for the specific embodiment shown and described without departing from the scope of the present disclosure. This disclosure covers all methods, apparatus, and articles of manufacture fairly falling within the scope of the appended claims either literally or under the doctrine of equivalents. This application is intended to cover any adaptations or variations of the embodiment discussed herein. Therefore, it is manifested and intended that the disclosure be limited only by the claims and the equivalents thereof.

What is claimed is:

1. A method of transferring data from a fast clock domain associated with a fast clock signal to a slow clock domain associated with a slow clock signal, the method comprising:
receiving first fast data from the fast clock domain during a first fast clock cycle, wherein the first fast clock cycle is a first full fast clock cycle in a first slow clock cycle;
propagating, during the first full fast clock cycle in the first slow clock cycle, the received first fast data to the slow clock domain;
receiving second fast data from the fast clock domain during a second fast clock cycle that is different from the first fast clock cycle, wherein the second fast clock cycle is at least partially in the first slow clock cycle; and refraining from propagating the second fast data to the slow clock domain for a period between the second fast clock cycle and another first full fast clock cycle in a second slow clock cycle.

2. The method of claim 1, further comprising:
propagating, during the another first full fast clock cycle in the second slow clock cycle, the received second fast data to the slow clock domain.

3. The method of claim 2, wherein said propagating the received second fast data further comprises:
enabling a drive mask signal during the another first full fast clock cycle in the second slow clock cycle; and
propagating the received second fast data to the slow clock domain based at least in part on the drive mask signal.

4. The method of claim 2, wherein the first slow clock cycle and the second clock cycle are two consecutive slow clock cycles of the slow clock signal.

5. A method of transferring data from a fast clock domain associated with a fast clock signal to a slow clock domain associated with a slow clock signal, the method comprising:
receiving first fast data from the fast clock domain during a first fast clock cycle, wherein the first fast clock cycle is a first full fast clock cycle in a first slow clock cycle; and
propagating, during the first full fast clock cycle in the first slow clock cycle, the received first fast data to the slow clock domain;
wherein said propagating the received first fast data further comprises:
enabling a drive mask signal during the first full fast clock cycle in the first slow clock cycle; and
propagating the received first fast data to the slow clock domain based at least in part on the drive mask signal.

6. A method of transferring data from a fast clock domain associated with a fast clock signal to a slow clock domain associated with a slow clock signal, the method comprising:
receiving first fast data from the fast clock domain during a first fast clock cycle, wherein the first fast clock cycle is a first full fast clock cycle in a first slow clock cycle;
propagating, during the first full fast clock cycle in the first slow clock cycle, the received first fast data to the slow clock domain;
receiving a fast valid signal during the first fast clock cycle and a second fast clock cycle, wherein the second fast clock cycle is at least partially in the first slow clock cycle;
propagating the received fast valid signal, as a slow valid signal, to the slow clock domain during the first fast clock cycle; and
refraining from propagating the received fast valid signal to the slow clock domain during the second fast clock cycle.

7. The method of claim 6, further comprising:
receiving a slow ready signal from the slow clock domain during the first slow clock cycle; and
generating, during at least a part of a last full fast clock cycle in the first slow clock cycle, a fast ready signal based at least in part on the slow ready signal and slow valid signal.

8. The method of claim 7, further comprising:
determining a completion of transfer of the first fast data from the fast clock domain to the slow clock domain, based at least in part on the generated fast ready signal and the fast valid signal.

9. The method of claim 7, wherein generating the fast ready signal further comprises:
generating the fast ready signal such that:
the fast ready signal begins after a beginning of the last full fast clock cycle in the first slow clock cycle; and
the fast ready signal ends before an end of the last full fast clock cycle in the first slow clock cycle.

10. A fast to slow (F2S) bus converter for transferring data from a fast clock domain associated with a fast clock signal to a slow clock domain associated with a slow clock signal, the fast clock signal including a plurality of fast clock cycles, and the slow clock signal including a plurality of slow clock cycles, the F2S bus converter comprising:
a first latch configured to propagate, during a first fast clock cycle, a first fast data from the fast clock domain to the slow clock domain, wherein the first fast clock cycle is a first full fast clock cycle in a first slow clock cycle; and
a second latch configured to propagate a fast valid signal to the slow clock domain during the first fast clock cycle.

11. The F2S bus convertor of claim 10, wherein the first latch is further configured to:
receive the first fast data from the fast clock domain during the first fast clock cycle;
receive a drive mask signal that is enabled during the first fast clock cycle; and
propagate, during the first fast clock cycle, the received first fast data to the slow clock domain based at least in part on receiving the drive mask signal.

12. The F2S bus convertor of claim 11, wherein the first latch is further configured to:
receive second fast data from the fast clock domain during a second fast clock cycle that is different from the first fast clock cycle, wherein the second fast clock cycle is at least partially in the first slow clock cycle;
refrain from propagating the second fast data to the slow clock domain for a period between the second fast clock cycle and another first full fast clock cycle in a second slow clock cycle; and
propagate, during the another first full fast clock cycle in the second slow clock cycle, the received second fast data to the slow clock domain.

13. The F2S bus convertor of claim 11, wherein the second latch is further configured to:
receive the fast valid signal during the first fast clock cycle and during a second fast clock cycle, wherein the second fast clock cycle is at least partially in the first slow clock cycle;
propagate the received fast valid signal, as a slow valid signal, to the slow clock domain during the first fast clock cycle; and
refrain from propagating the received fast valid signal to the slow clock domain during the second fast clock cycle.

14. A method of transferring data from a slow clock domain that is driven by a slow clock signal to a fast clock domain that is driven by a fast clock signal, the method comprising:
receiving slow data from the slow clock domain during a slow clock cycle;
refraining from propagating the slow data to the fast clock domain during a first fast clock cycle that is at least partially in the slow clock cycle, wherein the first fast clock cycle is not a last full fast clock cycle in the slow clock cycle; and
propagating, during at least a part of a second fast clock cycle, the received slow data to the fast clock domain, wherein the second fast clock cycle is a last full fast clock cycle in the slow clock cycle.

15. The method of claim 14, further comprising:

receiving a slow valid signal from the slow clock domain during the slow clock cycle based at least in part on receiving the slow data during the slow clock cycle;

refraining from propagating the slow valid signal to the fast clock domain during the first fast clock cycle; and output, during at least a part of the second fast clock cycle, the received slow valid signal to the fast clock domain.

16. The method of claim 14, further comprising:

receiving a fast ready signal from the fast clock domain during the first fast clock cycle and the second fast clock cycle, wherein the first fast clock cycle is a first full fast clock cycle in the slow clock cycle;

propagating, during the first fast clock cycle, the received fast ready signal to the slow clock domain as a slow ready signal; and refraining from propagating the fast ready signal to the slow clock domain during the second fast clock cycle.

17. The method of claim 16, further comprising:

generating a fast valid signal during at least a part of the second fast clock cycle, such that the fast valid signal begins after a beginning of the second fast clock cycle and ends before an end of the second fast clock cycle; and signing a contract in the fast clock domain, indicating a completion of transfer of the slow data from the slow clock domain to the fast clock domain, based at least in part on the fast ready signal and the fast valid signal.

\* \* \* \* \*